United States Patent [19]

Amao et al.

[11] Patent Number: 4,951,383
[45] Date of Patent: Aug. 28, 1990

[54] ELECTRONIC PARTS AUTOMATIC MOUNTING APPARATUS

[75] Inventors: Kenji Amao, Chiyodamachi; Kazuyoshi Ohyama, Ashikaga; Kenji Mizoguchi, Ohizumimachi; Tsuneshi Akaishi, Chizumimachi; Takayoshi Takeuchi, Ohizumimachi, all of Japan

[73] Assignee: Sanyo Electric Co., Ltd., Osaka, Japan

[21] Appl. No.: 435,286

[22] Filed: Nov. 9, 1989

[30] Foreign Application Priority Data

Nov. 14, 1988 [JP] Japan .................................. 63-286951
Aug. 21, 1989 [JP] Japan .................................. 1-214389
Aug. 22, 1989 [JP] Japan .................................. 1-216800

[51] Int. Cl.$^5$ .............................................. H05K 3/30
[52] U.S. Cl. ...................................... 29/721; 29/740; 29/743; 29/833; 356/375

[58] Field of Search ................. 29/720, 721, 740, 743, 29/833; 356/375, 399, 138

[56] References Cited

U.S. PATENT DOCUMENTS 4,747,198  5/1988  Asai et al. ............................ 29/407
4,793,707  12/1988 Hata et al. ......................... 29/721 X
4,867,569  9/1989  Mohara ............................. 29/721 X Primary Examiner—Carl E. Hall
Attorney, Agent, or Firm—Darby & Darby

[57] ABSTRACT

An electronic parts automatic mounting apparatus wherein a plurality of removing nozzles are disposed on a removing head portion, and a tipped electronic part held on the suitable removing nozzle is recognized by a recognizing means to correct a deviation in position thereof, whereby mounting accuracy of the part on a print substrate is enhanced and the recognition of the tipped electronic part held by the removing nozzle by the recognizing means can be positively carried out.

12 Claims, 29 Drawing Sheets

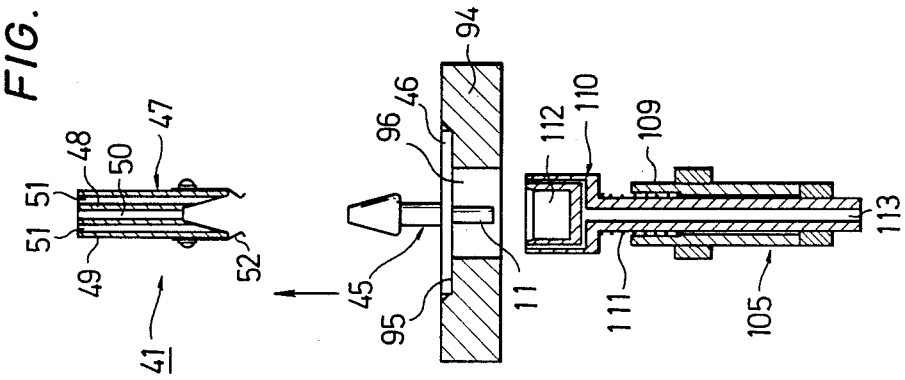
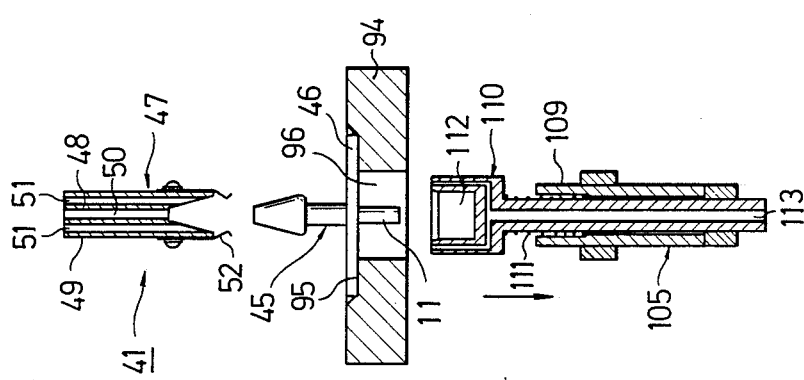

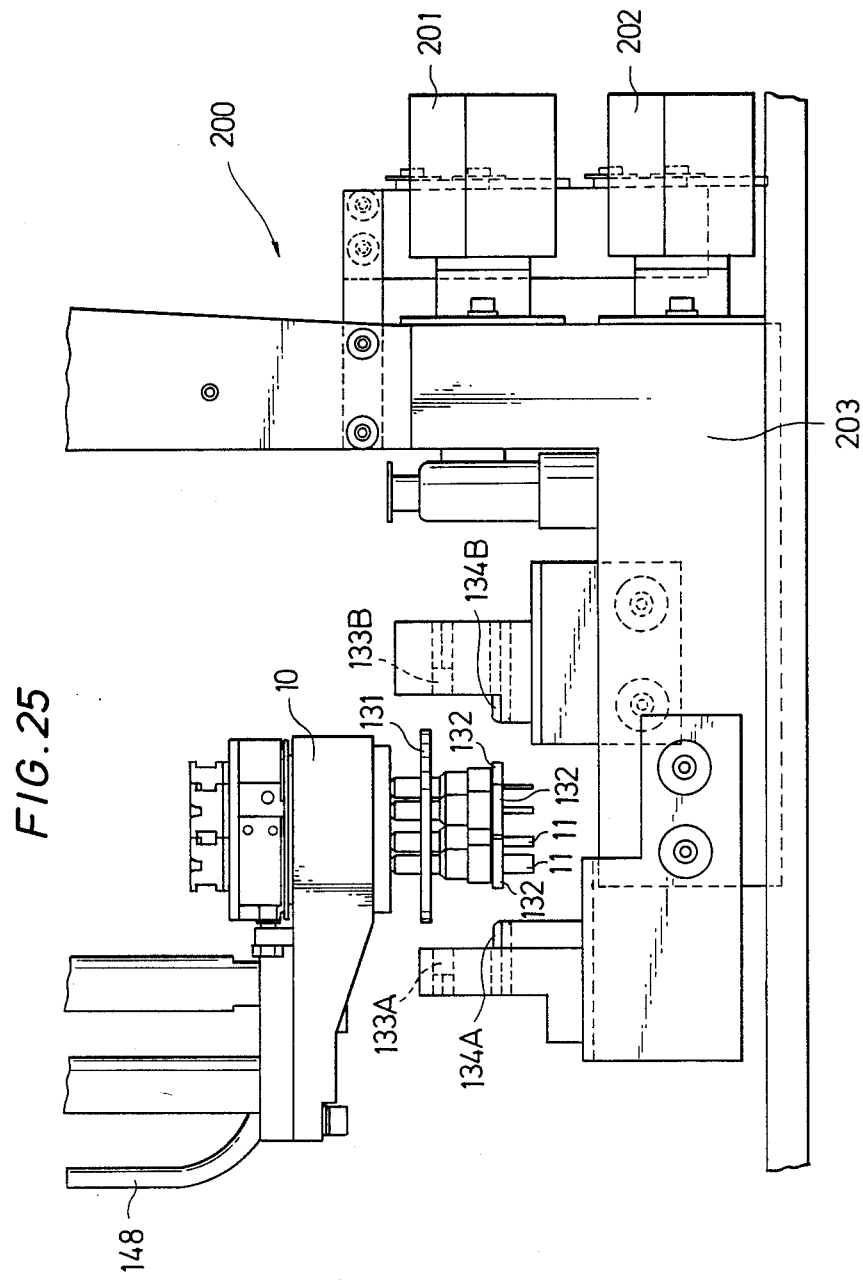

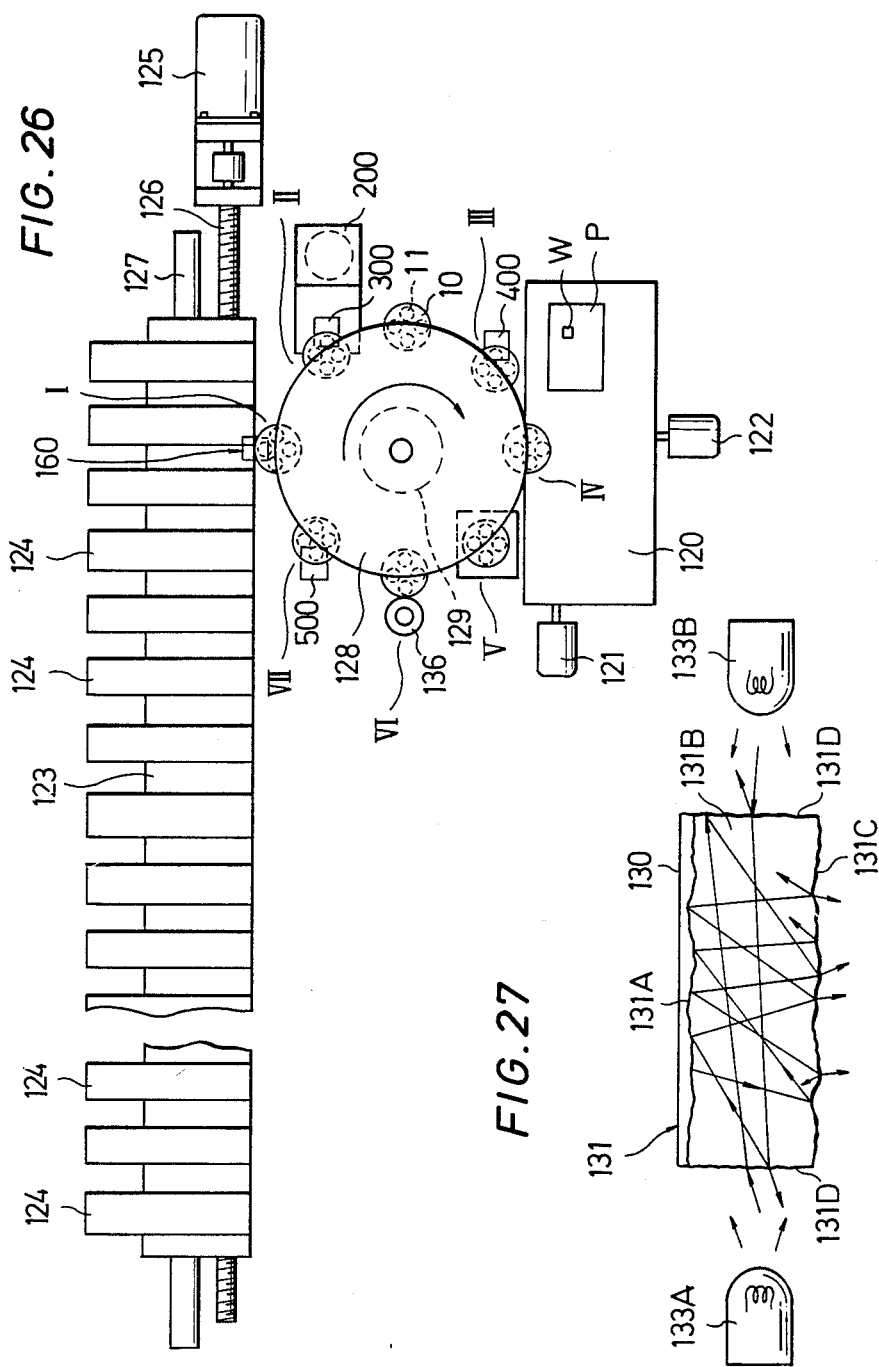

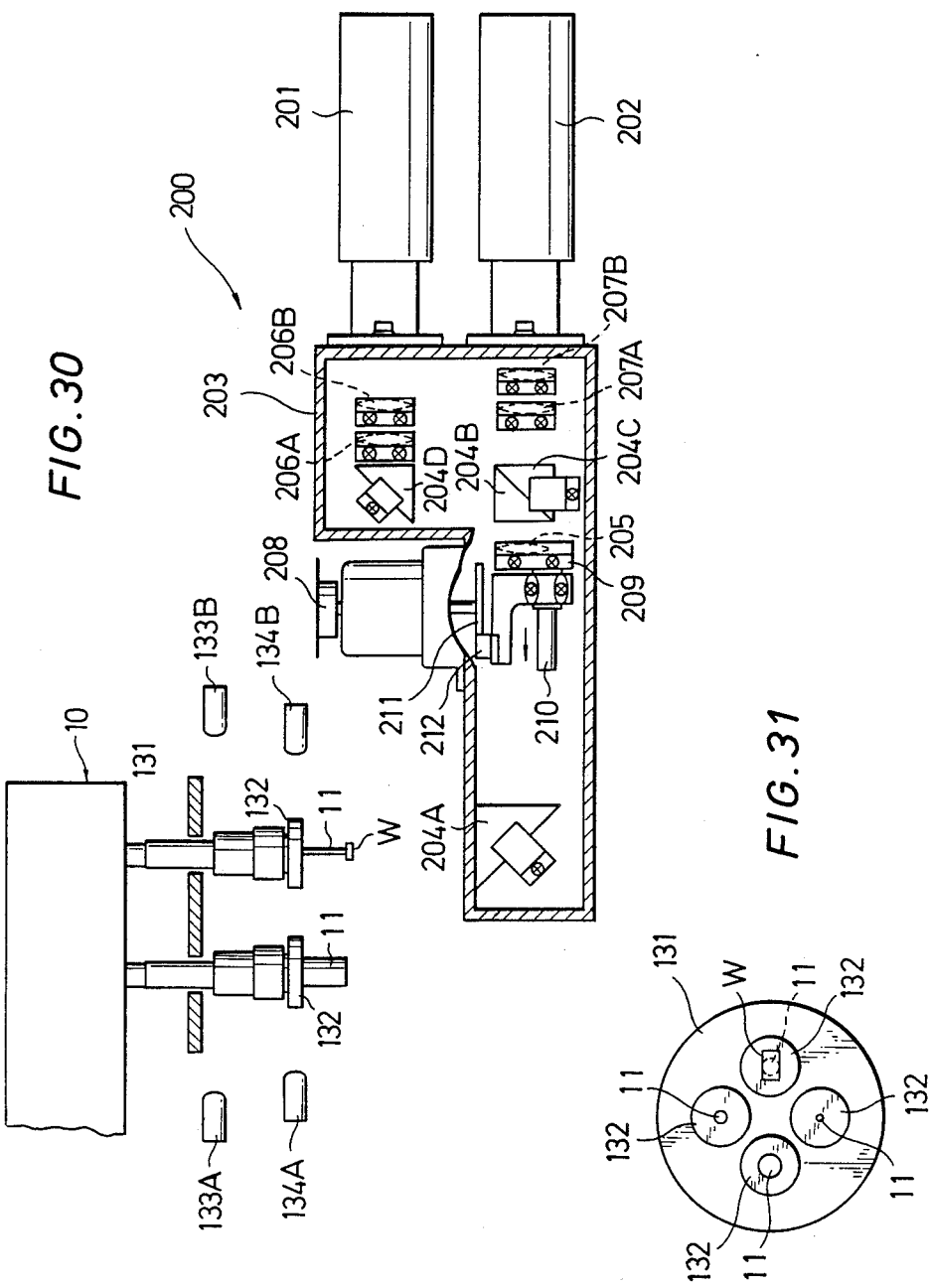

ELECTRONIC PARTS AUTOMATIC MOUNTING APPARATUS

BACKGROUND OF THE INVENTION

(1) Field of the Invention

The present invention relates to an electronic parts automatic mounting apparatus used to mount tipped electronic parts, for example, such as resistors, capacitors or transistors (hereinafter referred to as tipped parts) on a print substrate, and more specifically to an electronic parts automatic mounting apparatus which recognizes the tipped electronic parts held by removing nozzles prior to mounting them on the print substrate so as to correct a deviation in position thereof.

(2) Prior Art

A conventional part recognizing apparatus in the electronic parts automatic mounting apparatus of this kind is disclosed in Japanese Patent Application Laid-Open No. 63-54000 previously filed by the present applicant, in which removing nozzles are vertically movably and detachably mounted on removing head portions which move in an X-Y direction, and in case where positions of the tipped electronic parts attracted and held by the removing nozzles are detected, a light from a light source is irradiated on a lead wire of the tipped electronic part through a diffusion plate through which the removing nozzle extends and the position is picked up by an image pickup unit.

However, in such a conventional apparatus as described above, normally, the removing nozzles have an exchangeability so as to correspond to a small-diameter nozzle for attracting a small-sized part and a large-diameter nozzle for attracting a relatively large-sized part. When the small-sized part is attracted by the small-diameter nozzle, the diameter of a nozzle mounting portion is excessively large, and a diffused light irradiated through the diffusion plate does not sufficiently reach the lead wire of the small-sized part due to the formation of a hole through which the nozzle extends or the like, failing to accomplish the image pickup with accuracy.

Furthermore, in Japanese Patent Application Laid-Open No. 63-298573 which discloses an arrangement wherein an illumination portion and a diffusion plate are provided on a single removing nozzle, in case where a large-sized tipped electronic part is recognized, it is necessary to make the illumination portion large according to the size and shape or the like of parts.

In addition, other means for recognizing tipped electronic parts attacted and held by the removing nozzles through illumination means are disclosed in Japanese Patent Publication No. 62-13152 (a specification filed corresponding to U.S. Pat. No. 4,747,198), in which a removing head portion on which a removing nozzle is mounted is seen through over a predetermined range externally of at least an outer peripheral surface of the removing nozzle whereby the peripheral portion of the removing nozzle can be seen through a transparent member within the head portion from a portion above the removing head portion.

However, in the recognizing means of this kind for the tipped electronic parts attracted and held by the removing nozzles, an area occupied by one removing nozzle for attracting and holding, for example, a large-sized tipped electronic part, becomes large, and if a plurality of removing nozzles are mounted in a single removing head unit, the apparatus inevitably becomes large-sized.

SUMMARY OF THE INVENTION

It is an object of the present invention to provide an electronic parts automatic mounting apparatus comprising a removing head portion on which a removing nozzle is detachably mounted, part recognizing means for recognizing a tipped electronic part attracted by said removing nozzle, and part mounting means for correcting a deviation in position of the tipped electronic part on the basis of the result of recognition by said part recognizing means to mount the electronic part on a print substrate, wherein said part recognizing means comprises illumination means, a first diffusion means for irradiating a light from said illumination means toward the tipped electronic part attracted by said removing nozzle, a second diffusion means for transmitting, diffusing and irradiating the diffused light by said first diffusion means toward said tipped electronic part, and position detecting means for detecting a position of said tipped electronic part on which the diffused light is irradiated through said first and second diffusion means by means of a part image pickup camera, whereby the diffused light is positively irradiated on the tipped electronic part, and thereby even a small-sized tipped electronic part can be photographed and recognized with accuracy.

It is a further object of the present invention to provide an arrangement wherein a light from the illumination means is laterally irradiated on the diffusion plates constituting the first and second diffusion means, and thereby even if a plurality of removing nozzles are disposed on the removing head portion, irradiation of the diffused light on the tipped electronic part held by each of the removing nozzles can be positively effected and adequate recognition can be carried out without making the removing head portion larger.

It is another object of the present invention to provide an arrangement wherein a plurality of removing nozzles are disposed on a removing head portion, and each of the removing nozzles is made to vertically movably extend through the illumination means and the diffusion plates constituting the first and second diffusion means, whereby a pitch spacing between the removing nozzles is decreased so that the removing head portion can be miniaturized.

BRIEF DESCRIPTION OF THE DRAWINGS

FIGS. 15 to 24 stepwisely illustrates a state of exchanging a removing nozzle;

FIG. 25 is a schematic front view showing the entire structure of an electronic parts automatic mounting appartus according to the present invention;

FIG. 26 is a schematic plan view showing essential parts;

FIG. 27 illustrates the transmission and diffusion state of a diffusion plate by lateral irradiation of light;

FIG. 30 illustrates a state of recognizing a small-sized tipped electronic part;

FIG. 31 illustrates a removing nozzle as viewed from the underside in the state of recognizing the small-sized tipped electronic part;

DETAILED DESCRIPTION OF THE INVENTION

Figure 1:
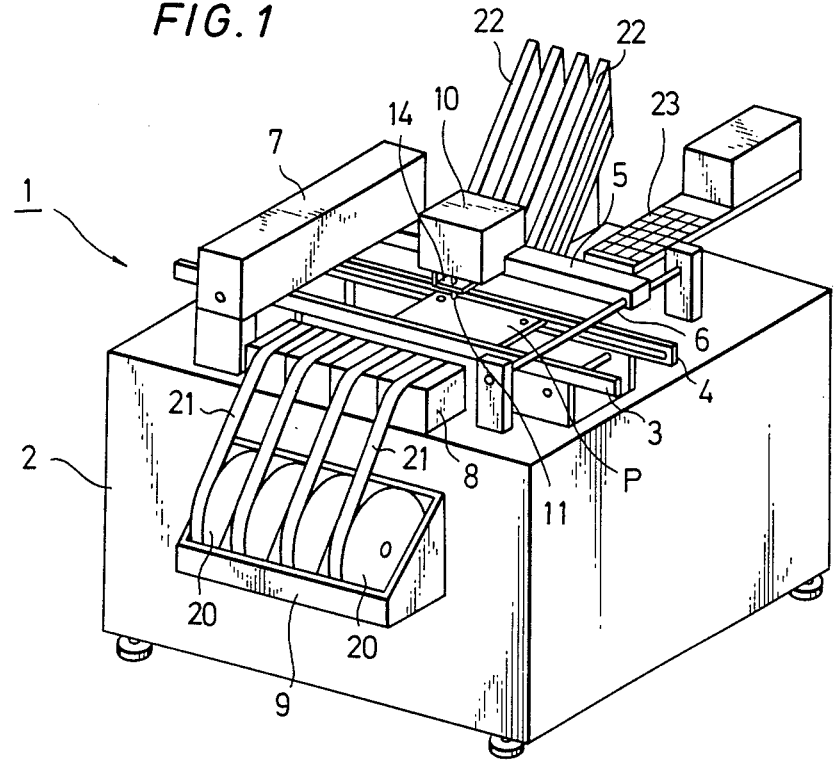
FIG. 1 is a schematic external view showing the entire structure of a first embodiment of an electronic parts automatic mounting apparatus according to the present invention.

The detailed mode of the electronic parts automatic mounting apparatus according to the present invention will be described hereinafter in detail with reference to embodiments shown in the drawings.

FIGS. 1 to 4 show a first embodiment of an electronic parts automatic mounting apparatus according to the present invention. FIG. 1 is an external view showing the entire structure of the apparatus.

Reference numeral 1 designates an electronic parts automatic mounting apparatus. A pair of conveyors 3 and 4 for positioning and transporting a print substrate P are disposed on a trestle 2.

An attraction head portion 10 as nozzle mounting means is arranged above the print substrate P positioned and transported by the pair of conveyors 3 and 4, and a removing nozzle 11 for attracting and holding a tipped electronic part W is mounted on the undersurface of the removing head portion 10.

The removing head portion 10 can be guided and moved in the X-Y direction by means of a first guide member 5 in a direction of axis X and second and third guide members 6 and 7 in a direction of axis Y through a driving source not shown.

Reference numberal 8 designates a tape feeder unit as part supply means, which comprises a receiving box 9 disposed laterally of the trestle 2, a plurality of part supply reels 20 received in the receiving box 9, and part receiving tapes 21 respectively wound on the part supply reels 20.

The tape feeder unit 8 delivers pitch by pitch the part receiving tapes 21 wound on the part supply reels 20, respectively, to selectively feed the tipped electronic parts W received in the part receiving tapes 21, respectively.

Reference numeral 22 designates a part magazine for receiving the tipped electronic parts W in a longitudinally stacked state. Reference numeral 23 designates a part tray on which the tipped electronic parts W are placed.

Figure 2:
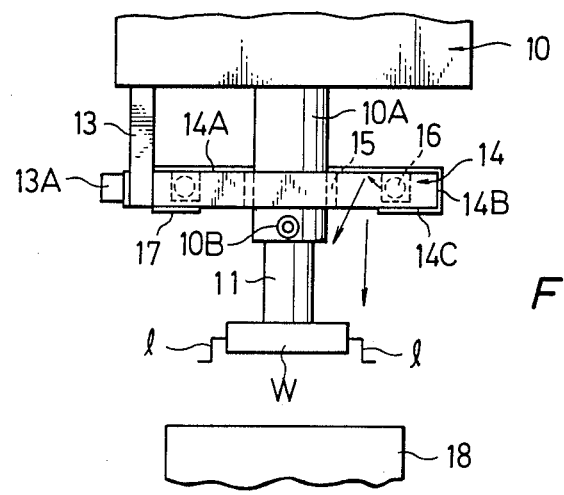
FIG. 2 illustrates the state of detecting a position of a small-sized part attracted by a removing nozzle.

That is, in the removing head portion 10, the removing nozzle 11 for attracting the tipped electronic part W is inserted into and held by a nozzle mounting portion 10A and detachably mounted by means of a screw 10B, as shown in FIG. 2.

The nozzle mounting portion 10A supporting the removing nozzle 11 vertically extends through a center hole 15 of a first diffusion plate 14 as a first diffusion means detachably supported below the removing head portion 10 through a support member 13 and a screw 13A, and can be moved upward and downward by a driving source not shown for removing and mounting the tipped electronic parts W.

Figure 3:
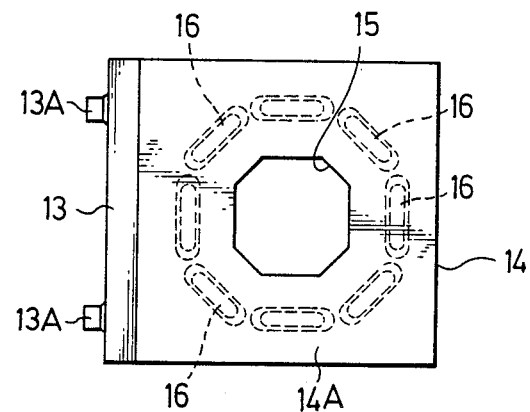
FIG. 3 is a plan view of a diffusion plate constituting a first diffusion means.
Figure 4:
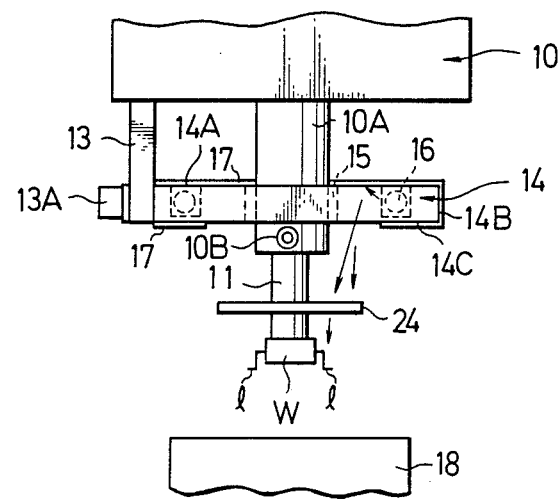
FIG. 4 illustrates the state of detecting a position of a large-sized part attracted by the removing nozzle.

The first diffusion plate 14 as the first diffusion means is formed from a transparent plate made of acryl or glass with a plurality of bulbs 16 as illumination means radially embedded in an outer peripheral portion thereof as shown in FIG. 3 and formed with reflective layers 17 in an upper surface portion 14A, a side portion 14B and a partial outer peripheral bottom surface portion 14C thereof as shown in FIG. 2. The reflective layer 17 is coated with a white coating and coated with a black coating on the white coating, on which is pasted a film which reflects light such as a silver paper so as to cover each of said bulbs 16.

That is, the first diffusion plate 14 has its center hole 15 extended through the nozzle mounting portion 10A as shown in FIG. 2 and irradiates light from each of the bulbs 16, while being diffused by the reflective layer 17, toward a lead wire (l) of the chipped electronic part W attracted by the removing nozzle 11 detachably mounted on the nozzle mounting portion 10A through the screw 10B.

Reference numeral 18 designates a part image pickup camera installed below the removing nozzle 11. The image pickup camera 18 constitutes a position detecting means for photographing, from the lower portion, the lead wire (l) of the tipped electronic part W attracted by the removing nozzle 11 and irradiated by the diffusion plate 14 as the first diffusion means to thereby detect a position of the lead wire (l) of the tipped electronic part W.

Next, the operation of detecting a position of the lead wire (l) of the tipped electronic part W attracted by the removing nozzle 11 will be described below.

First, when a tipped electronic part W is fed by either tape feeder unit 8, part magazine 22 or part tray 23, the removing head portion 10 is moved in the X-Y direction to attract the tipped electronic part on the removing nozzle 11.

The light from the bulbs 16 as the illumination means embedded in the diffusion plate 14 as the first diffusion means is irradiated on the tipped electronic part W attracted by the removing nozzle 11 by the transmission and diffusion action caused by the first diffusion plate 14.

The thus irradiated lead wire (l) of the tipped electronic part W is photographed from the lower portion by the part image pickup camera 18 whereby the position thereof is detected and recognized.

The embodiment shown in FIG. 2 renders possible the detection of position of the tipped electronic part W supplied by either tape feeder unit 8, part magazine 22 or part tray 23 in case of recognizing large-sized parts to effect the work of recognizing the parts.

However, when the detection of position of a small-sized tipped electronic part W attracted by the removing nozzle 11 for a small-sized part is carried out in the state of position detection in case of recognizing the large-sized part as in the embodiment shown in FIG. 2, the diameter of the nozzle mounting portion 10A is excessively large, or the diffusion plate 14 as the first diffusion means is formed with the center hole 15 through which the nozzle mounting portion 10A extends, and therefore, sufficient irradiation of difused light cannot be carried out merely by the first diffusion plate 14.

In view of the foregoing, in the present invention, when a small-sized part is recognized, a second diffusion plate 24 formed from a transparent plate made of acryl or glass as a second diffusion means is mounted in a radial peripheral portion of a removing nozzle 11 for a small-sized part replaceably mounted on the nozzle mounting portion 10A so that the second diffusion plate 24 is to be positioned below the first diffusion plate 14.

The second diffusion plate 24 causes the diffused light by the first diffusion plate 4 to further transmit and diffuse so that the diffused light is positively without unevenness irradiated toward the lead wire (l) of the small-sized tipped electronic part W attracted by the removing nozzle 11 for the small-sized part.

In this manner, when a deviation in position of the tipped electronic part W attracted by the removing nozzle is recognized by the recognizing means, the removing head portion 10 is moved in the X-Y direction on the basis of said data and the removing nozzle 11 is turned in a direction of $\theta$ to thereby correct an amount of deviation in position of the tipped electronic part W.

While in the above-described first embodiment, the bulbs 16 have been used as the illumination means, it is to be noted that the illumination means are not limited thereto but, for example, electroluminescent lamps (EL) or the like may be used.

FIGS. 5 to 24 show a second embodiment of the electronic parts automatic mounting apparatus according to the present invention. Reference numeral 30 designates an electronic parts automatic mounting apparatus.

Figure 5:
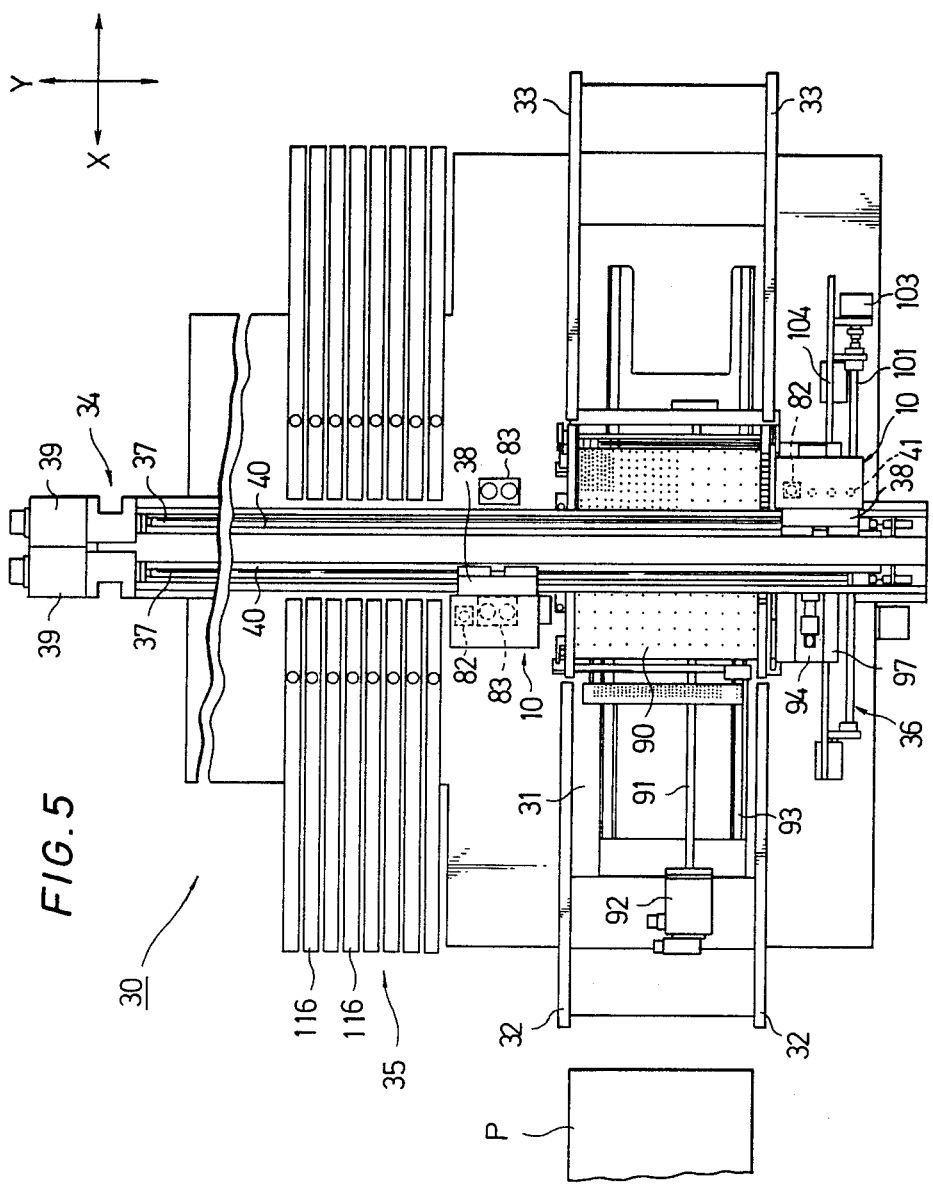
FIG. 5 is a schematic plan view showing the entire structure of a second embodiment of an electronic parts automatic mounting apparatus according to the present invention.
Figure 6:
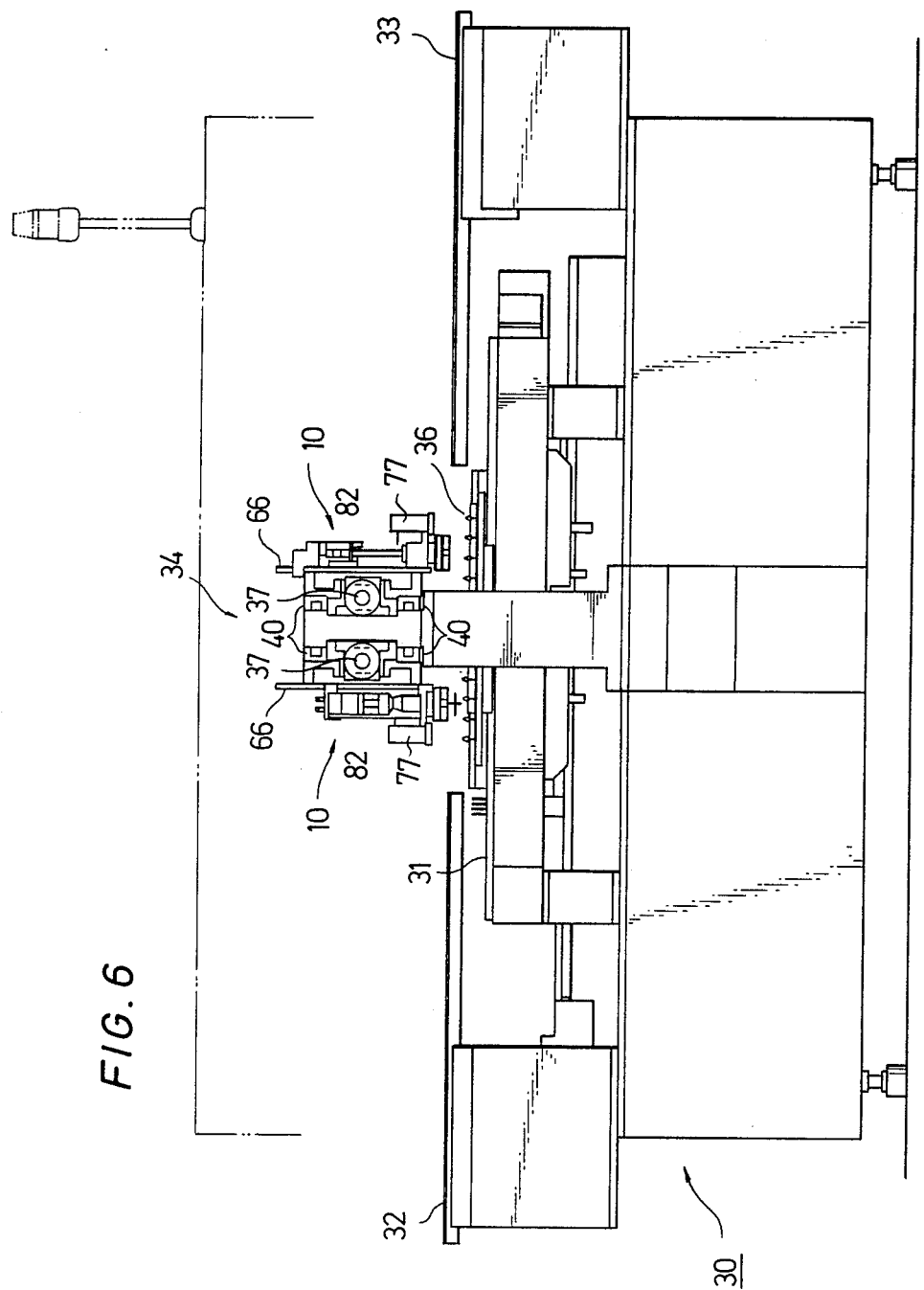
FIG. 6 is a front view of the same.

This automatic mounting apparatus 30 comprises, as shown in FIGS. 5 and 6, a pair of part supply conveyors 32 for transporting a print substrate P to an X-table portion 31, a pair of part ejection conveyors 33 for ejecting the print substrate P ejected from the X-table portion 31 to a downstream apparatus not shown, a Y head portion 34, a part supply portion 35 for supplying tipped electronic parts W, and a tool exchange portion 36 for exchanging a tool having a removing nozzle 11 which will be described later at the extreme end thereof.

Figure 7:
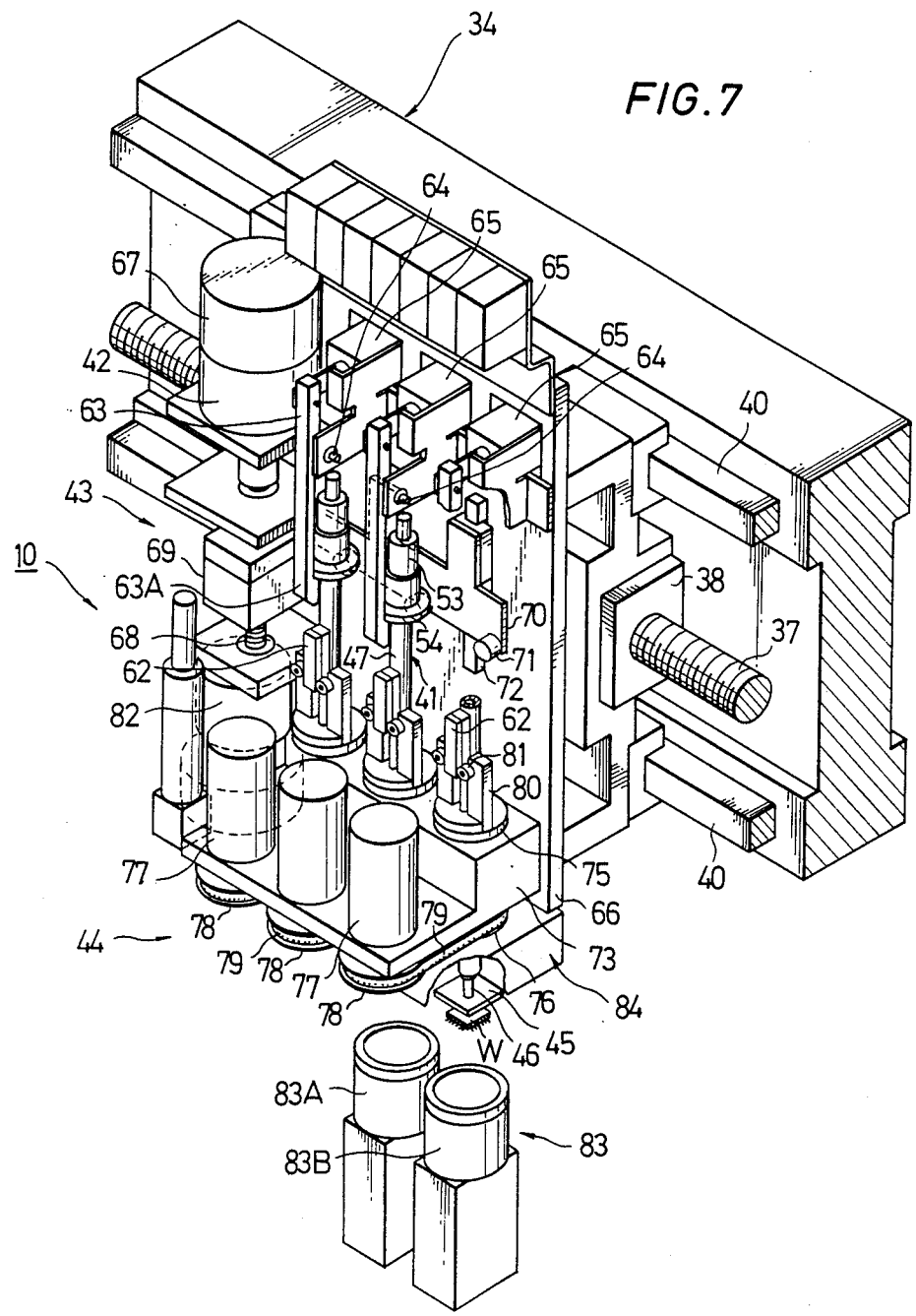
FIG. 7 is an enlarged perspective view of essential parts of a removing head portion.

The Y head portion 34 is provided with removing head portions 10 and 10 as shown in FIGS. 5 to 7. These removing heads 10 and 10 are mounted on nuts 38 and 38 for heads fitted in ball threads 37 and 37. The ball threads 37 and 37 are rotatively driven by drive motors 39 and 39 and guided and moved in the Y-direction through linear guides 40 and 40 so that the tipped electronic part W supplied from the part supply portion 35 is mounted on the print substrate P on the X-table portion 31.

The removing head portion 10 comprises, as shown in FIG. 7, three or more vertically movable moving members 41 having a removing nozzle 11 capable of exchanging a tool having a tipped electronic part W attracted and held at the extreme end thereof, a stopper mechanism 42 for defining each of the moving members 41 so as not to move the latter downward, a vertically movable driving mechanism 43 and a rotational mechanism 44 to rotate in a direction of $\theta$.

Reference numeral 84 designates an illumination unit as illumination means which will be described later for illuminating a tipped electronic part W attracted and held at the extreme end of the removing nozzle 11.

Figure 8:
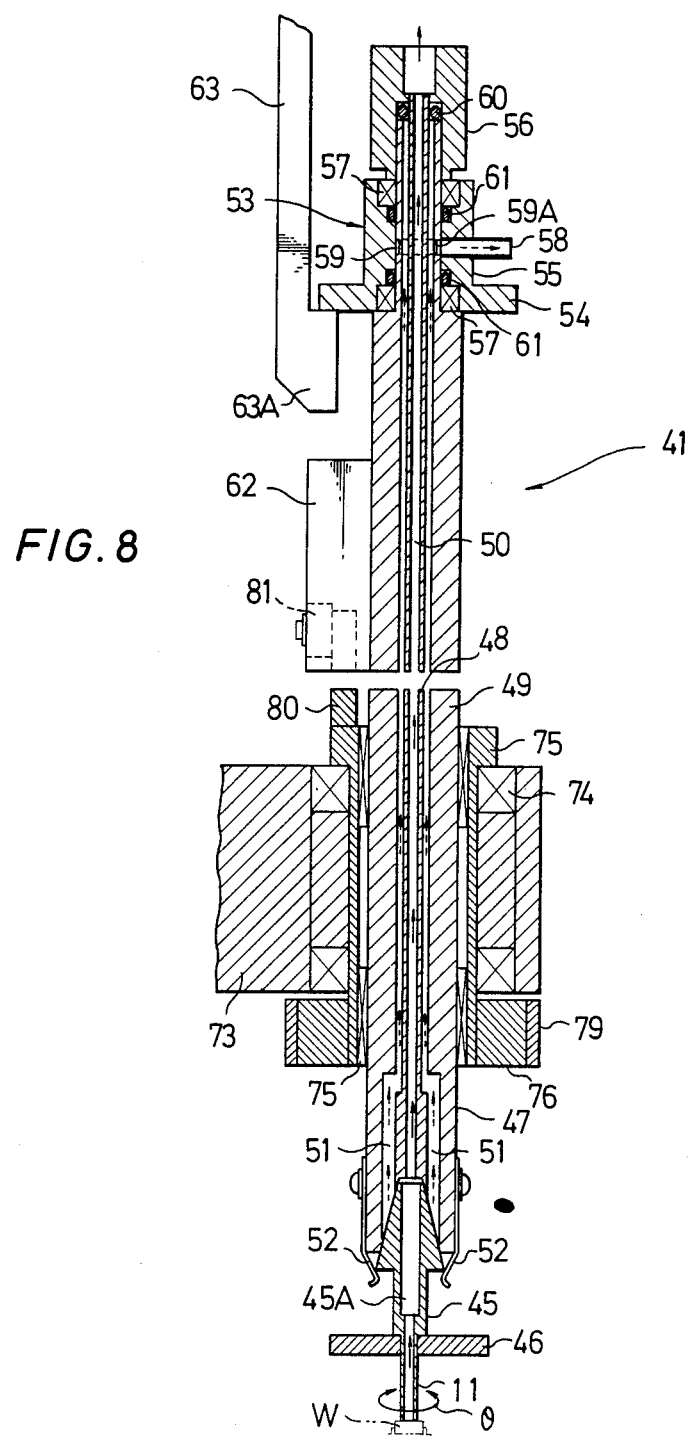
FIG. 8 is a longitudinal sectional view of a vertically movable member of the removing nozzle.

The vertically movable member 41 is detachably provided with a tool 45 with a removing nozzle 11 projected at the extreme end thereof, as shown in FIG. 8. The tool 45 is interiorly formed with a vaccum passage 45A for attracting the tipped electronic part W, and outer peripherally formed with a milky diffusion plate 46 as a second diffusion means which will be described later for irradiating light on the tipped electronic part W. Many removing nozzles 11 and diffusion plates 46 of different sizes are prepared according to the sizes and shapes of the tipped electronic parts W.

Reference numeral 47 designates a shaft for attracting and holding the tool 45 and comprises an inner tube 48 and an outer tube 49. The inner tube 48 of the shaft 47 has therein a first vacuum passage 50 in communication with the vacuum passage 45A of the tool 44, and a second vacuum passage 51 for attracting the tool 45 is formed between the outer tube 48 and the outer tube 49. A pair of plate springs 52 and 52 are mounted on the lower end of the outer tube 49, and the tool 45 is detachably held at the extreme end of the shaft 47 by the pair of plate springs 52 and 52 and the vacuum attraction caused by the second vacuum passage 51.

Reference numeral 53 designates a double pipe coupling mounted on the upper portion of the shaft 47, and comprises a rotation guide nut 55 with a flange 54 formed in the outer peripheral portion thereof and a nut 56. The rotation guide nut 55 is rotatable by a bearing 57 with respect to the shaft 47, and a pipe 58 for vacuum to be communicated with the second vacuum passage 51 is fitted into the outer tube 49 of the shaft 47.

An annular goove 59 is formed in the outer peripheral portion of the outer tube 49 of the shaft 47 into which the pipe 58 for vacuum is fitted. The groove 59 is partly opened at 59A whereby even if the shaft 47 is rotated within the rotation guide shaft 55 by the rotational mechanism 44, the second vacuum passage 51 is communicated with the pipe 58 for vacuum through the groove 59 and the opening 59A.

The nut 56 constituting the double pipe coupling 53 is secured to the outer tube 49 of the shaft 47 and rotates as the shaft 47 rotates.

Reference numeral 60 designates a first O-ring for sealing the second vacuum passage 51 so as to avoid a leak of vacuum within the nut 56, and 61 a second O-ring for sealing so as to avoid a leak of vacuum from the groove 59 through the bearing 57 within the rotation guide nut 55.

The pipe 58 for vacuum in communication with the first vacuum passage 50 and the second vacuum passage 51 is connected to a vacuum source not shown, and the pipe 58 for vacuum is also connected to a compressed air source through a switching valve not shown. Reference numeral 62 designates a member to be defined secured to the shaft 47 to define a rotational range of the shaft 47 by the rotational mechanism 44.

On the other hand, the stopper mechanism 42 comprises a stopper lever 63 having a pawl 63A at the lower end thereof, a support shaft 64 for supporting the upper end of the stopper lever 63, a solenoid 65 for swinging the stopper lever 63 about the support shaft 64 by the forward and backward movement thereof, and a mounting plate 66 mounted on the nut 38 for head to which is secured the solenoid 65.

That is, when the solenoid 65 is projected in its deenergized state, the stopper lever 63 has its pawl 63A engaged with the lower surface of the flagne 54 of the vertically movable member 41 to lock the vertically movable member 41 so as to define the downward movement thereof, and by the backward movement caused by the energization of the solenoid 65, the pawl 63A is disengaged from the flange 54 to unlock the vertically movable member 41 to render the downward movement possible.

The vertical movable drive mechanism 43 comprises a driving motor 67, a ball thread 68 rotatively driven by the driving motor 67, a vertically movable nut 69 with which the ball thread 68 is meshed, and a vertically movable plate 70 on which the nut 69 is mounted. The vertically movable plate 70 is provided with an engaging pin 71 engaged with the lower surface of the flange 54 provided on the shaft 47 of the vertically movable member 41 to support the vertically movable member 41 and can be moved upward and downward along a linear guide 72 mounted on the mounting plate 66 when the locking state caused by the stopper lever 63 is released. The vertically movable member 41 is moved upward and downward while being supported on the engaging pin 71 by the rotation of the driving motor 67 in the aforesaid unlocked state.

The rotational mechanism 44 comprises, as shown in FIGS. 7 and 8, a block 73 suspended from the mounting plate 66, a bearing member 74 embedded in the block 73, a guide member 75 guided by the bearing member 74 and rotated in a direction of $\theta$, a driven pulley 76 mounted in the outer periphery of the lower portion of the guide member 75, a driving motor 77 mounted on the block 73, a drive pulley 78 provided on the drive motor 77 adjacent to the driven pulley 76, and a timing belt 79 extended over the drive pulley 78 and the driven pulley 76.

That is, the guide member 75 is rotated by the driving of the drive motor 77 through the pulleys 76 and 78 and the timing belt 79, and the shaft 47 can be moved upward and downward while being guided by the guide member 75.

Reference numerals 80 and 80 designate a pair of locking members having locking rollers 81 and 81 formed on the upper portion of the guide member 75. The rollers 81 and 81 are engaged from both sides with the member 62 to be defined secured to the shaft 47 to thereby define the rotation of the shaft 47 in a direction of $\theta$.

Accordingly, when the guide member 75 is rotated by the drive motor 77, the shaft 47 and the removing nozzle 11 are rotated in a direction of $\theta$ through the locking members 80 and 80 and the member 62 to be defined.

Reference numeral 82 designates a substrate recognizing camera provided in the removing head portion 10 to recognize a position of the print substrate P. Reference numeral 83 designates a part image pickup camera. The part image pickup camera 83 recognizes a detection of attraction position, an attitude, a bend of lead or a floatation of lead of the tipped electronic part W attracted by the removing nozzle 11 moved to a predetermined corresponding position by the movement of the removing head portion 10.

That is, the part image pickup camera 83 comprises a first high-magnification image pickup camera 83A and a second low-magnification image pickup camera 83B, and a spacing of installation between these two cameras 83A and 83B is made to coincide with a spacing between the vertically movable members 41 mounted on the removing head portion 10, that is, a spacing between the removing nozzles 11.

The first high-magnification image pickup camera 83A is positioned at a higher level than that of the second low-magnification image pickup camera 83B and used to recognize the small-sized tipped electronic part W or the tipped electronic part W of which spacing between lead wires is narrow. The second low-magnification image pickup camera 83B is positioned at lower level than that of the first high-magnification image pickup camera 83A and used for the recognition of wide angles for large-sized tipped electronic parts W or the like.

Next, an illunination unit 84 as illumination means mounted at the lower portion of the removing head portion 10 will be described hereinafter.

Figure 9:
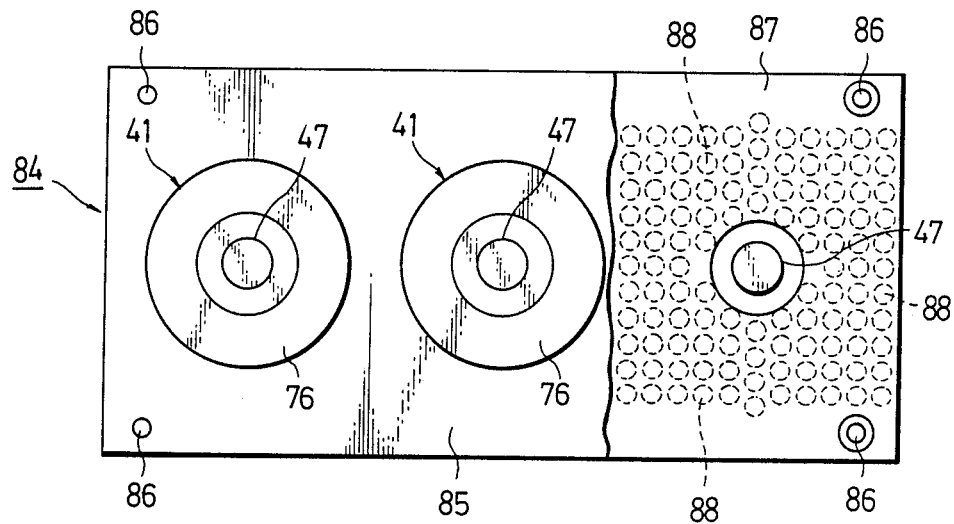
FIG. 9 is a partly sectioned plan view of an illumination unit.
Figure 10:
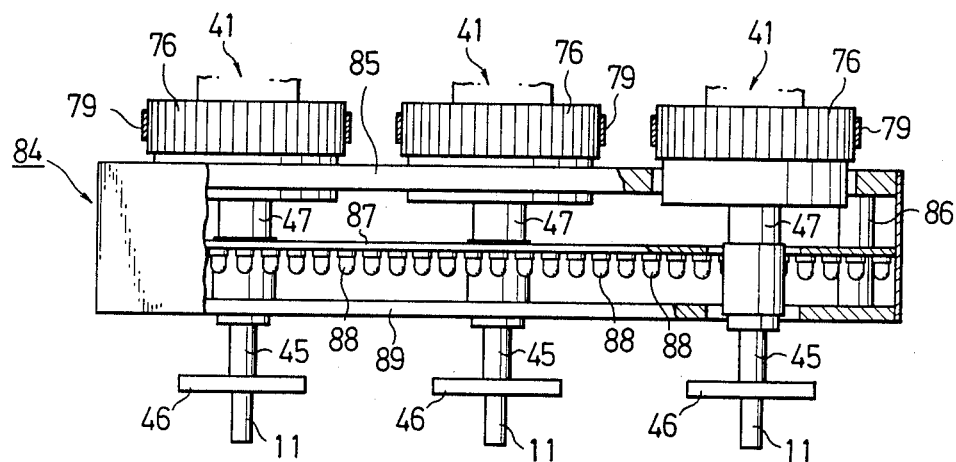
FIG. 10 is a partly sectioned front view of the illumination unit.

The illumination unit 84 illuminates a tipped electronic part W when the tipped electronic part W attracted by the removing nozzle 11 is recognized by the part image pickup camera 83, and has the structure as shown in FIGS. 7, 9 and 10.

Reference numeral 85 designates a rectangular planar frame of which bottom formed with the illumination unit 84 is opened, the frame being secured to the mounting plate 66 of the removing head portion 10. The shaft 47 of each of the vertically movable members 41 on which the removing nozzle 11 is mounted is positioned in correspondence to the upper surface of the frame 85, and mounting pins 86 are provided at respective corners. These mounting pins 86 support a base plate for illumination 87 disposed within the frame 85, and a number of light emitting members 88 such as LED are mounted on the undersurface of the base plate for illumination 87.

Reference numeral 89 designates a milky diffusion plate as a first diffusion means disposed on the undersurface of the frame 85 of the illumination unit 84, the diffusion plate being mounted by the mounting pins 86 at regular intervals from the base plate for illumination 87 on which the light emitting members 88 are mounted.

The lower end of the shaft 47 of the vertically movable member 41 extends through the illumination unit 84 through the frame 85, the base plate for illumintion 87 and the diffusion plate 89 so that said lower end may be vertically moved upward and downward. The tool 45 having the removing nozzle 11 and the diffusion plate 46 as the second diffusion means at the extreme end thereof is detachably mounted on the lower end of the shaft 47.

That is, the diffusion plate 89 as the first diffusion means transmits and diffuses the light emitted from the light emitting members 88 to make even the bright and dark in dependency of locations. The thus unified diffused light is further transmitted and diffused by the diffusion plate 46 as the second diffusion means provided in the outer peripheral portion of the removing nozzle 11 into an uniform diffused light to illuminate the tipped electronic part W attracted by the removing nozzle 11.

The tipped electronic part W attracted by the removing nozzle 11 may be irradiated merely by the diffusion plate 89 as the first diffusion means disposed on the undersurface of the illumination unit 84 but in case of the small-sized tipped electronic part W, the diffused light from the diffusion plate 89 does not reach the electronic part W because the shaft 47 of the vertically movable member 41 is made to vertically movably extend through the diffusion plate 89.

In view of the foregoing, in the present invention, the diffused light from the diffusion plate 89 is again transmitted and diffused by the diffusion plate 46 provided in the periphery of the removing nozzle 11 of the tool 45, whereby even the small-sized tipped electronic part W, the diffused light can be sufficiently irradiated thereon.

The diffusion plate 46 provided on the tool 45 has different sizes according to the sizes and shapes of the tipped electronic parts W attracted by the removing nozzle 11 so that the diffused light through the diffusion plate 46 is irradiated over the entire tipped electronic part W.

In this case, the small-sized tipped electronic part W can be illuminated by the large diffusion plate 46 but it is effective in terms of space to use a small diffusion plate 46 for the tool 45 of the removing nozzle 11 for attracting a small tipped electronic part W. Thereby, no interference occurs even if the diffusion plate 46 is provided on the shaft 47 of each vertically movable member 41.

In case where a large diffusion plate 46 is required to illuminate a large-sized tipped electronic part W, for example, tools 45 having a large diffusion plate 46 may be mounted on shafts 47 and 47 of vertically movable members 41 and 41 on opposite sides except a middle vertically movable member 41 among three vertically movable members 41, 41 and 41 arranged adjacent to one another, as in the illustrated embodiment.

Further, a light emitting area emitted by the light emitting members 88 of the base plate for illumination 87 is required to have a wider area than the diffusion plate 46 every size and shape of the tipped electronic part W. When the illumination unit 84 is provided for each vertically movable member 41, the spacing between the removing nozzles 11 becomes wide. Therefore, a number of light emitting members 88 are disposed on a single common illuminating plate 87 whereby the light emitting area is reduced, and the spacing between the removing nozzles 11 is made as narrow as possible to miniaturized the removing head portion 10.

Alternatively, in recognizing the tipped electronic part W, all of the light emitting members 88 on the illuminating base plate 87 may be illuminated or the light eliminating members 88 as needed may be partly illuminated for each removing nozzle 11.

On the other hand, the X-table portion 31 comprises, as shown in FIG. 5, an X-table 90 for placing a print substrate P thereon supplied from the part supply conveyors 32 and 32, a ball thread 91 meshed with a nut not shown mounted on the X-table 90, a drive motor 92 for rotatively driving the ball thread 91, and a linear guide 93 for guiding and moving the X-table 90 along the X-direction through the ball thread 91 by driving the drive motor 92.

That is, the tipped electronic part W attracted by the removing nozzle 11 of the removing head portion 10 is moved to a predetermined position on the print substrate 10 positioned in place position on the X-table 90 by the movement of the removing head portion 10 in the Y-direction and the movement of the X-table 90 in the X-direction, and the electronic part W is mounted by the downward movement of the vertically movable member 41.

Figure 11:
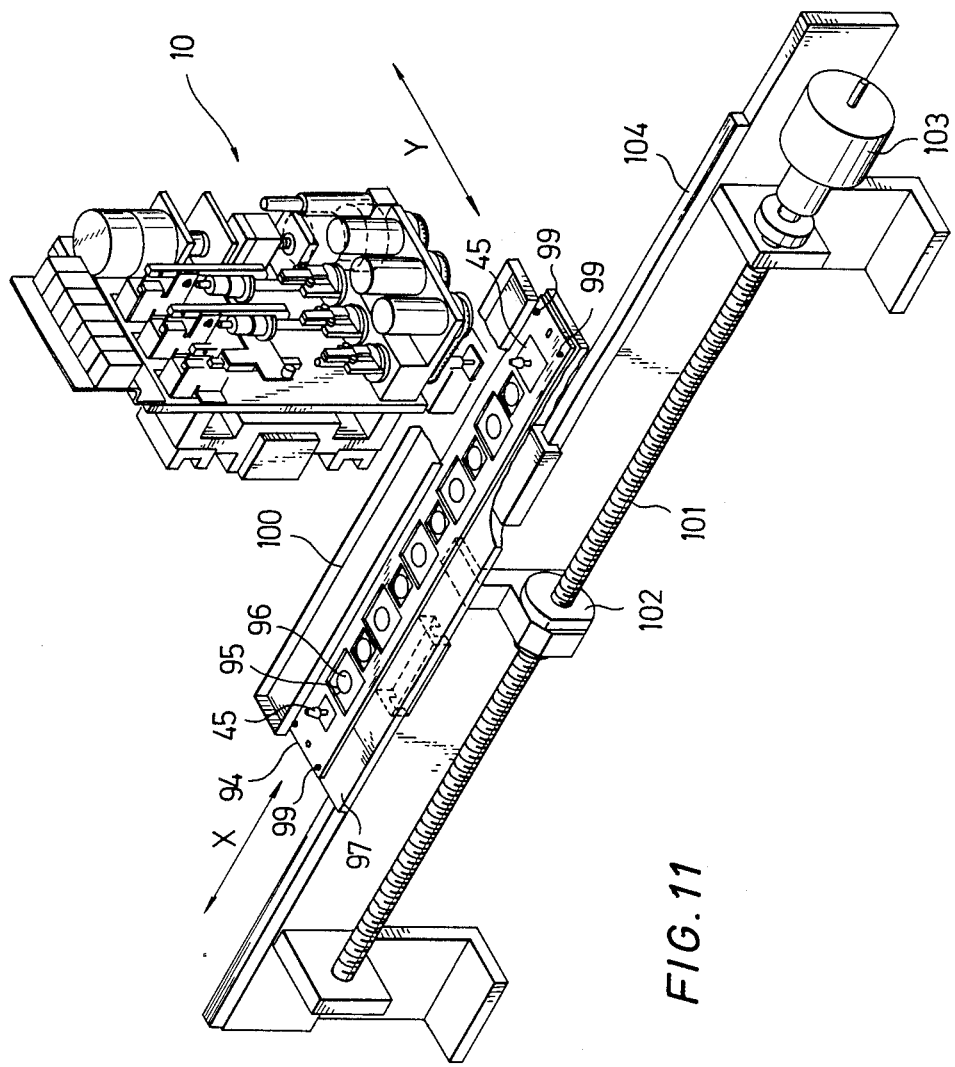
FIG. 11 is a perspective view showing a driving state of the removing head portion when a removing nozzle is replaced.
Figure 12:
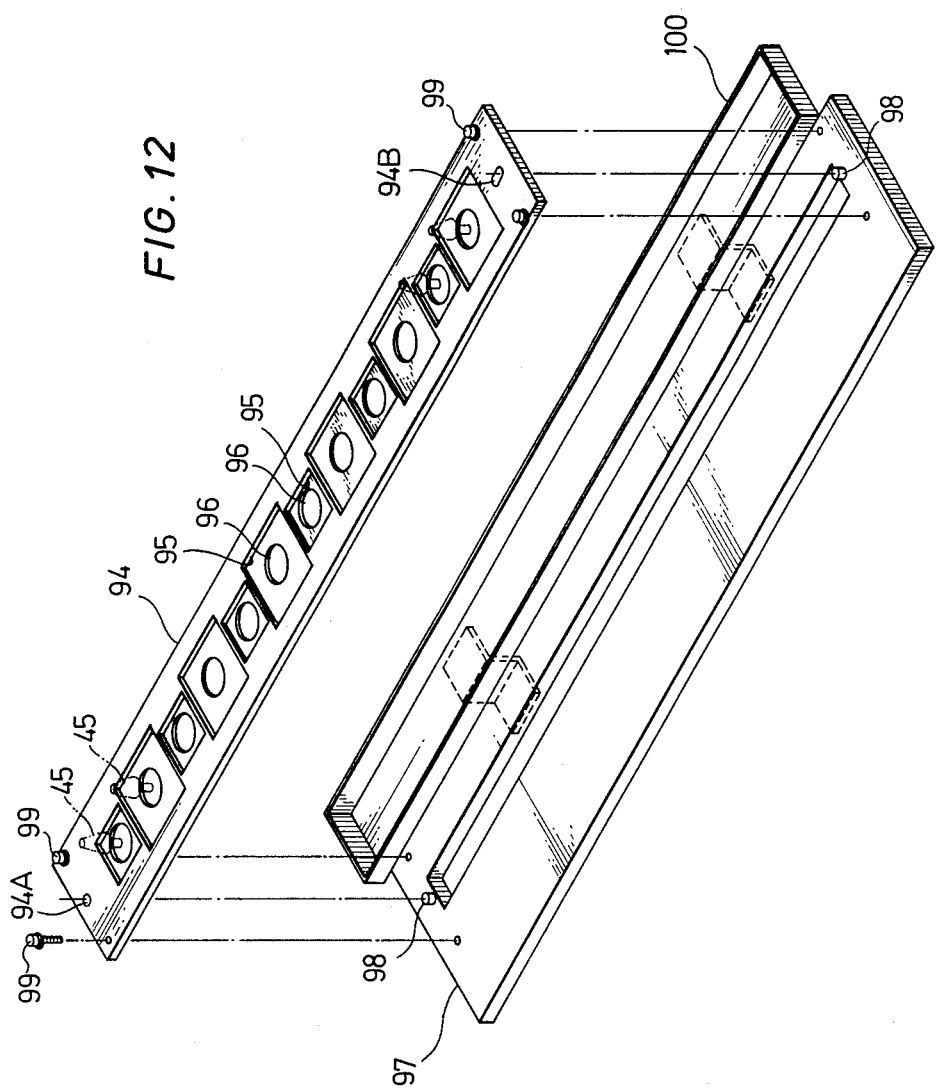
FIG. 12 is an exploded perspective view showing a state of mounting a tool table on which a removing nozzle is placed onto a movable bed.

The tool exchanging portion 36 has a tool table 94 in which tools 45 of kinds different according to the sizes and shapes of the removing nozzle 11 and the diffusion plate 46 are arrayed in the X-direction and received, as shown in FIGS. 5, 11 and 12. This tool table 94 is formed with a tool receiving recess 95 while being adjusted to the size of the diffusion plate 46 of each of the tools 45 so that each of the tools 45 may be received in each of the recesses 95 without deviation. A throughhole 96 is opened in the central portion of the recess 95 to allow the removing nozzle 11 to escape and to replace a tool.

Several kinds of the tool tables 94 are prepared according to the kinds of tools 45 and are detachably and replaceably mounted on the movable bed 97. Two locating pins 98 are provided on the movable bed 97 so that these pins 98 and 98 are respectively fitted into a locating hole 94A and a slot 94B provided in correspondence to the tool tables 94 and located each other, in which state they are fixed by bolts 99.

Reference numeral 100 designates a work receiving box mounted on the movable bed 97, which receives therein tipped electronic parts W aligned in the X-direction which have been judged to be defective by the part image pickup camera 83 as the part recognizing means. The movable bed 97 is mounted on a nut 102 for tool with which a ball thread 101 for tool meshes, and the movable bed is moved along the X-direction through a linear guide 104 by rotation of the ball thread 101 by means of a drive motor 103. With the movement of the movable bed 97, the tool table 94 and the work receiving box 100 also move along the X-direction.

Figure 13:
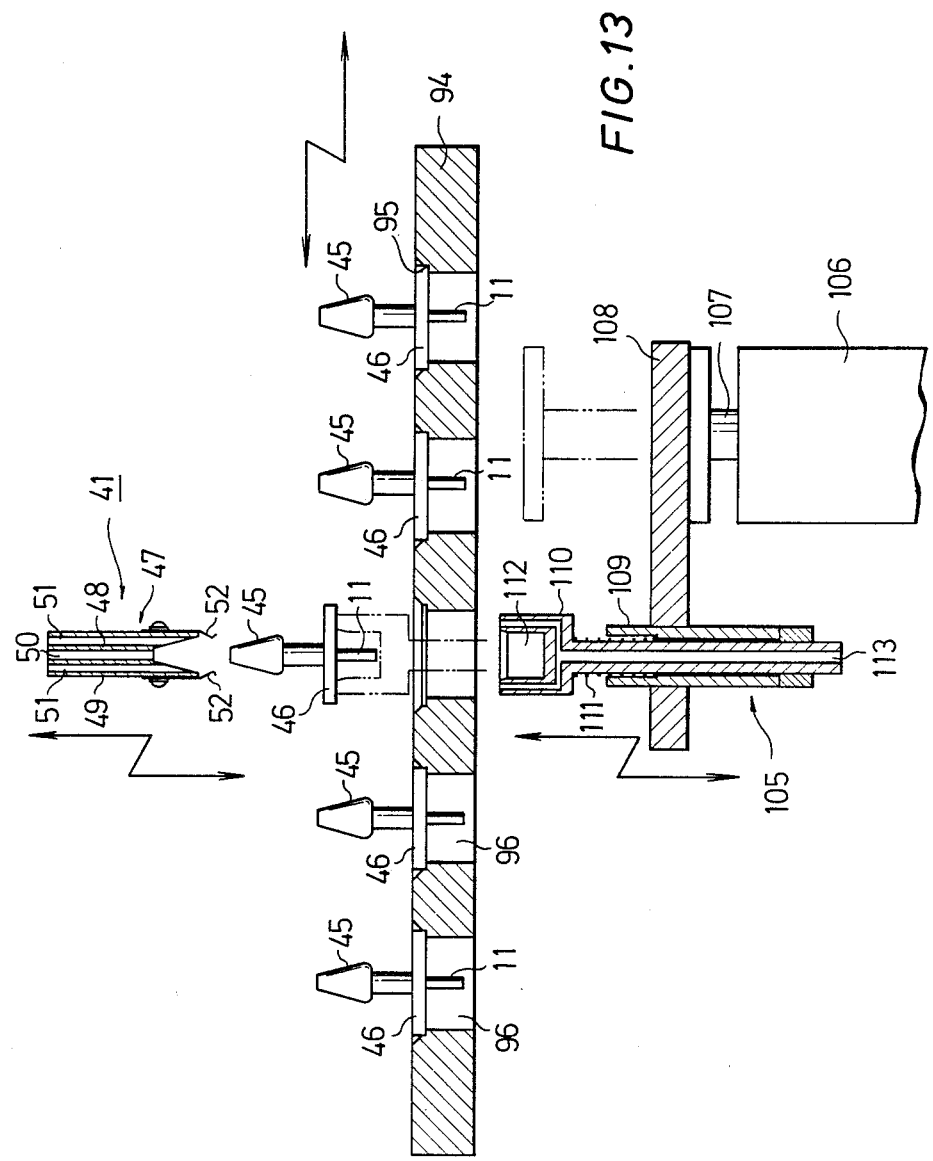
FIG. 13 illustrates a state of exchanging a removing nozzle.

As shown in FIG. 13, reference numeral 105 designates a tool exchanging mechanism installed below the tool table 94. This tool exchanging mechanism 105 comprises a cylinder 106, a tubular pad holding member 109 mounted on a rod 107 of the cylinder 106 through a support member 108, an attraction pad 110 vertically movably inserted into the pad holding member 100 and having an attraction portion at the extreme end thereof formed to have a large-diameter shoulder, and a coil spring 111 for upwardly biasing and supporting the attraction pad 110.

The attraction pad 110 has its attraction portion at the extreme end positioned capable of extending through a through-hole 95 extending through the tool table 94, and is formed in the central portion of the upper surface thereof with a recess 112. This recess 112 comprises an escape for the removing nozzle 11 projected toward the lower portion of the tool 45 when as shown by the dash-dotted contour lines, the attraction portion at the extreme end of the attraction pad 110 is extended through the through-hole 95 from the lower portion thereof as the result of the driving of the cylinder 106 to attract and raise the lower surface of the diffusion plate 46 of the tool 45 along with the cushioning action of the coil spring 111. Reference numeral 113 designates a vacuum passage connected to a vacuum source not shown for attracting the tool 45 formed within the attraction pad 110, several vacuum passages 113 being opened in the upper surface of the attraction pad 110.

Figure 14:
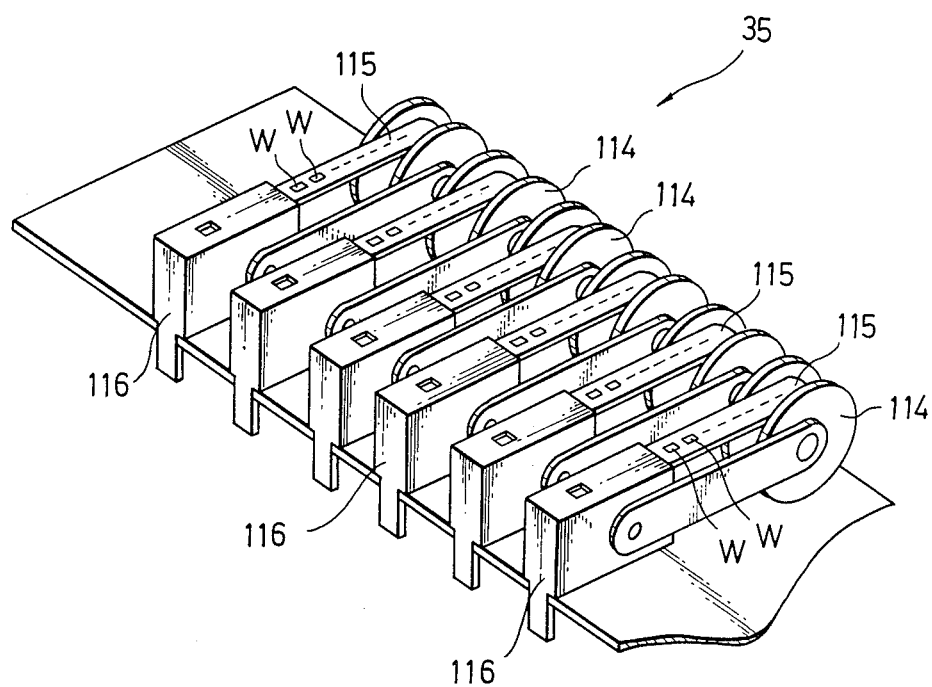
FIG. 14 is a perspective view of a supply station for tipped electronic parts.

FIG. 14 shows the structure of a part supply portion 35 for supplying tipped electronic parts W.

The part supply portion 35 delivers and supplies tipped electronic parts W received in tapes 115 wound about a plurality of receiving reels 114, respectively, through a part supply device 116 according to the sizes and shapes thereof. In this case, the part supply devices 116 are aligned so that the adjacent spacing therebetween is adjusted to the spacing between the three vertically movable members 41 mounted on the removing head portion 10. When the kinds of the tools 45 mounted on the shafts 47 of the vertically movable members 41, respectively, are the same, if these three removing nozzles 11 are simultaneously moved downward, three tipped electronic parts W supplied from the respective part supply devices 116 can be simultaneously attracted.

Next, the operation of the apparatus according to the above-described second embodiment of the present invention will be described hereinafter.

Figure 15:
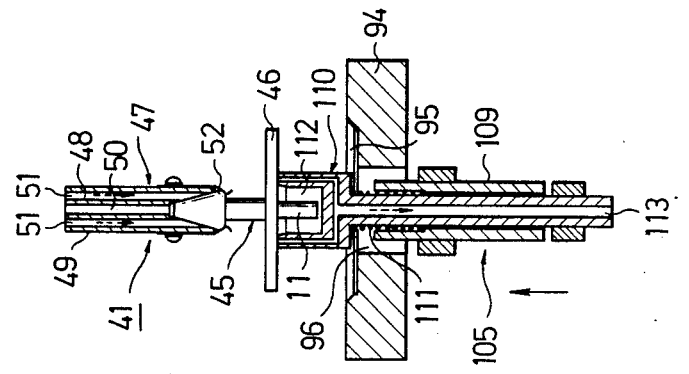

First, in case where the tool 45 mounted on the shaft 47 of the vertically movable member 41 is replaced, as shown in FIGS. 15 to 24, the removing head portion 10 is moved in the Y-direction to position the tool 45 upwardly of the recess 95 of the tool table 94, as shown in FIG. 15.

Figure 16:
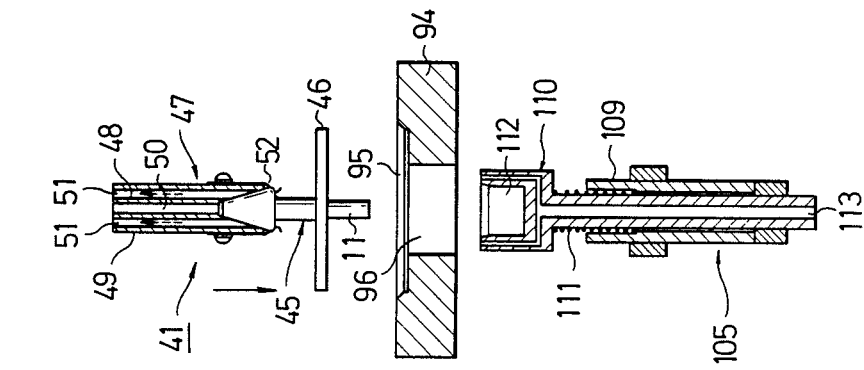
Figure 17:
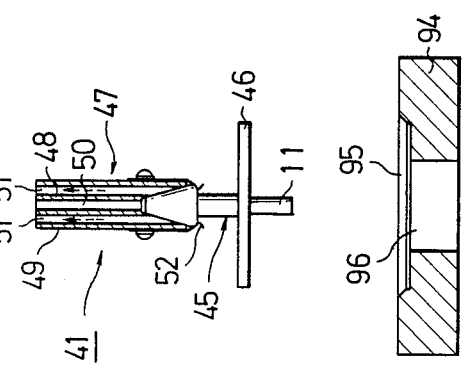

In this state, the vertically movable member 41 is moved downward to a predetermined position, as shown in FIG. 16, and the attraction pad 110 is moved upward by the driving of the cylinder 106, as shown in FIG. 17, whereby the tool 45 mounted on the shaft 47 is attracted by the attraction pad 110.

Figures 20, 21, 22:
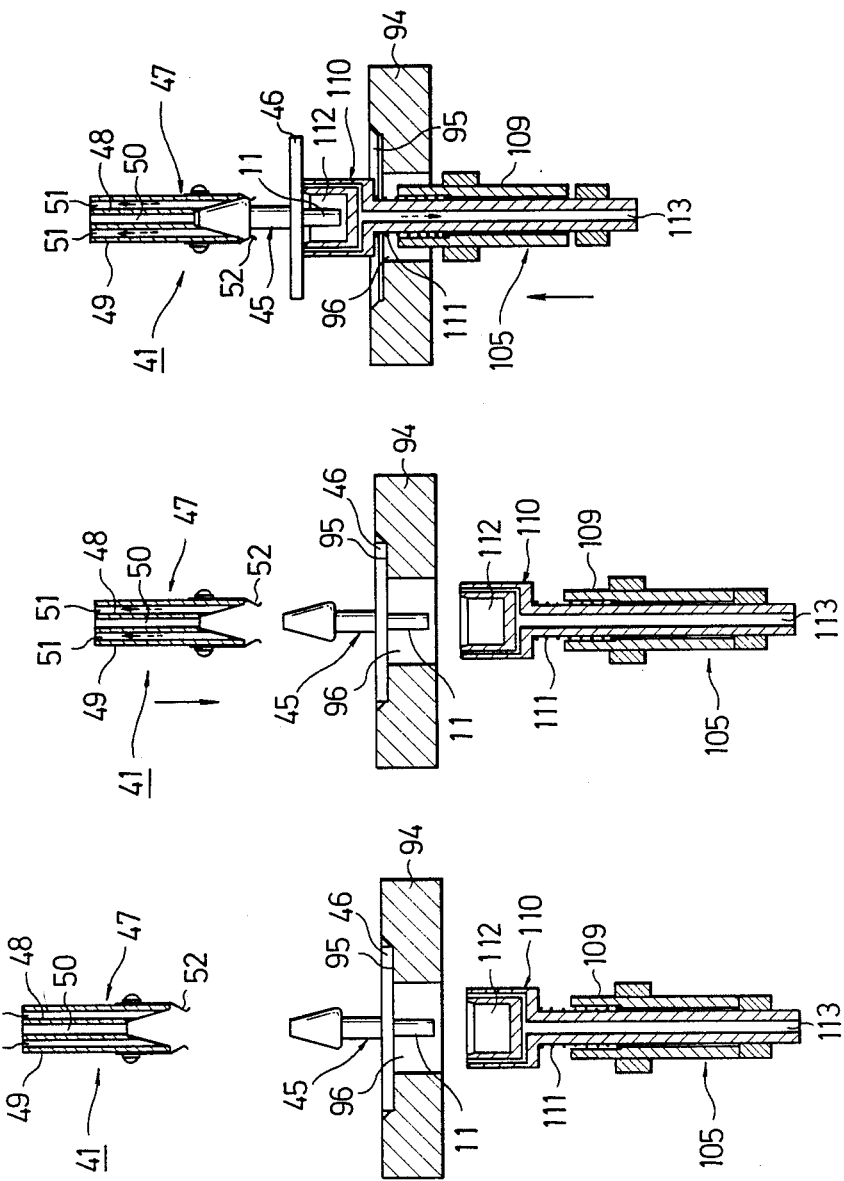

Subsequently, the attraction pad 110 is moved downward, as shown in FIG. 18, to remove the tool 45 mounted on the shaft 47 against the resilient holding force of the plate springs 52 and 52 to move it downward as it is, whereby the tool 45 is received into the recess 95 of the tool table 94, whereas the vertically movable member 41 is again moved upward, as shown in FIG. 19, to assume the original stand-by position as shown in FIG. 20.

The tool table 94 is then moved in the X-direction, and moved so that the lower end of the shaft 47 of the vertically movable member 41 may be positioned in correspondence to the upper portion of the recess 95 on the tool table 94 in which the exchanged tool 45 is received, as shown in FIG. 21.

In this state, the vertically movable member 41 is again moved downward to a predetermined position, whilst the attraction pad 110 is moved upward, as shown in FIG. 22, to attract and hold the tool 45 received in the recess 95 of the tool table 94 and is moved upward as it is, whereby the tool 45 is resiliently held by the plate springs 52 and 52 provided at the lower end of the shaft 47.

Figure 23:
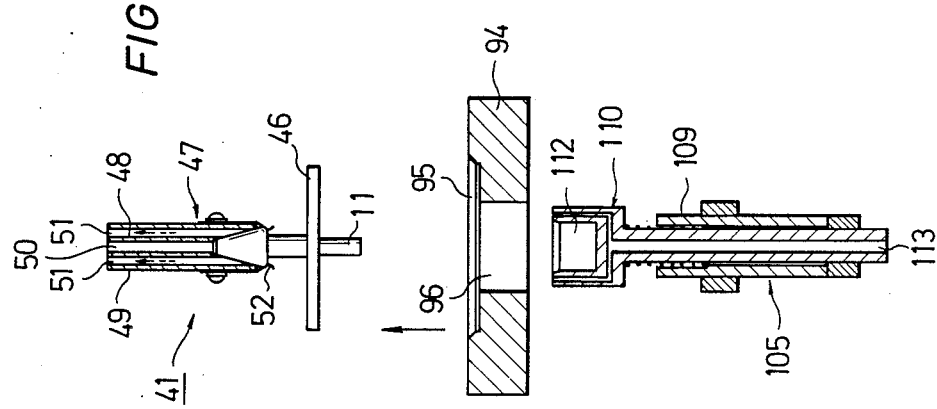
Figure 24:
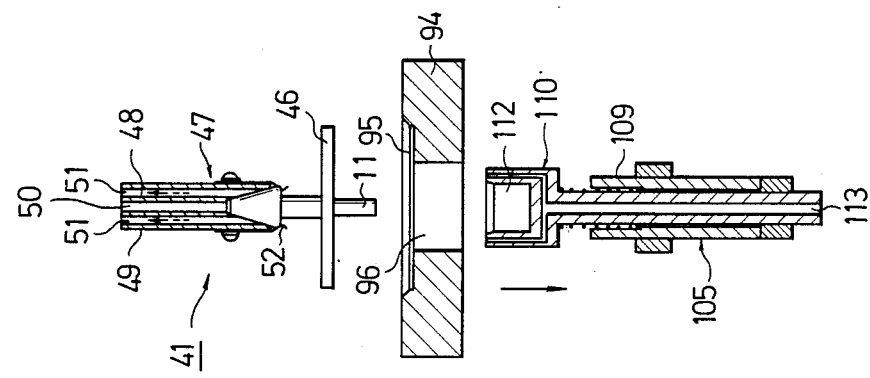

In the manner as described above, after the tool 45 has been mounted on the shaft 47 of the vertically movable member 41, the attraction pad 110 is released from its attraction state and moved downward, as shown in FIG. 23, and the vertically movable member 41 is moved upward, as shown in FIG. 24, to replace the tool 45.

When the desired tool 45 replaced is mounted on the shaft 47 of the vertically movable member 41 constituting the removing head portion 10, the removing head portion 10 is moved in the X-Y direction toward the part supply portion 35, and the desired tipped electronic part W supplied from the part supply portion 35 is attracted by the removing nozzle 11 provided at the extreme end of the tool 45.

In this manner, the removing head portion 10 with the tipped electronic part W attracted by the removing nozzle 11 is moved to a predetermined focal point at which the part image pickup camera 83 as the part recognizing means is located.

When the tipped electronic part W attracted by the removing nozzle 11 of the removing head portion 10 assumes the focal point of the part image pickup camera 83, the light emitting members 88 on the illumination unit 84 as the illumination means are turned on, which light is transmitted and diffused by the first diffusion plate 89 and further transmitted and diffused by the second diffusion plate 46 provided in the outer peripheral portion of the removing nozzle 11 of the tool 45 to irradiate the diffused light uniformly toward the whole surface of the tipped electronic part W attracted by the removing nozzle 11.

In this case, even if the tipped electronic part W is of a small size, the diffused light through the second diffusion plate 46 can be positively irradiated thereon.

The tipped electronic part W illuminated by the illumination means as described above is photographed by the part image pickup camera 83 whereby the attraction position, attitude and the like are recognized.

Where the tipped electronic part W attracted by the removing nozzle 11 is of a small size, the first high-magnification image pickup camera 83A, among the part image pickup cameras 83, is used for recognition, whereas where the tipped electronic part W attracted by the removing nozzle 11 is of a large size, the second low-magnification image pickup camera 83B is used for recognition. The recognition is selectively carried out by the respective cameras, as described above.

Upon completion of the recognition of the tipped electronic part W attracted by the removing nozzle 11, the removing head portion 10 is moved in the Y-direction by the movement of the Y-head portion 34 on the basis of the recognized data. The X-table portion 31 is moved in the X-direction and the removing nozzle 11 is rotated in the θ-direction whereby corrections of deviation in position in the X-Y-θ directions are effected. After such corrections of deviation in position have been carried out, mounting of the part on the print substrate P is carried out.

Particularly, where the correction of deviation in position due to a deviation of angle in a θ direction is carried out, the guide member 75 is rotated along the bearing member 74 through the pulleys 76 and 78 and the timing belt 79 by an amount for correction of deviation in angle by the driving of the drive motor 77 of the rotational mechanism 44, as shown in FIGS. 7 and 8, at which time the shaft 47 is rotated by the rotation of the bearing member 74 while being defined by the member to be defined 62 and the locking rollers 81 and 81 of the locking members 80 and 80 whereby the removing nozzle 11 mounted on the extreme end of the shaft 47 through the tool 45 is rotated by an amount for an angle to be corrected.

FIGS. 25 to 43 show a third embodiment of the electronic parts automatic mounting apparatus according to the present invention.

As shown in FIGS. 25 and 26, reference numeral 120 designates an X-Y table on which a print substrate P is placed, and the X-Y table can be moved in directions of X and Y by the driving of X-axis servomotor 121 and Y-axis servomotor 122.

Reference numeral 123 designates a part supply bed for tipped electronic parts W. The part suply bed 123 has a number of part supply devices 124 arranged in parallel and can be moved in the X-direction through a guide rod 127 by the rotation of a ball thread 126 caused by the driving of a servomotor 125 in the part supply portion.

Reference numeral 128 designates a rotational board, and a number of removing head portions 10 are provided on the undersurface thereof. The rotational board 128 is intermittently rotated by the driving of a servomotor 129 of the rotational board to attract, remove and transport the tipped electronic parts W supplied from the respective part supply devices 124 by a plurality of removing nozzles 11 provided on the removing head portion 10 so that the tipped electronic parts W are mounted on the print substrate P positioned and placed on the X-Y table 120.

Reference numeral 131 designates a diffusion plate as a first diffusion means extended over the whole removing nozzles 11 of the removing head portion 10, and reference numeral 132 designates a diffusion plate as a second diffusion means provided in a peripheral radial portion of the removing nozzle 11, both the diffusion plates 131 and 132 being formed from transparent plates such as acryl or glass.

Reference numerals 133A and 133B designate light source members as first illumination means which irradiate light laterally toward the first diffusion plate 131 extended and mounted over the whole removing nozzle 11 of the removing head portion 10, and reference numerals 134A and 134B likewise designate light source members as second illumination means which irradiate light laterally toward the second diffusion plate 132.

The function of the first and second diffusion means 131 and 132, and the first and second illumination means 133A, 133B and 134A, 134B will be described hereinafter in connection with the first diffusion plate 131 and the light source members 133A and 133B in FIG. 27. Since the function of the second diffusion plate 132 and the light source members 134A and 134B is similar to the former, the description thereof is omitted.

As shown in FIG. 27, an upper surface 131A of the diffusion plate 131 is roughly finished by a file or the like and applied with a milky coating film 130, for example, to form a reflective diffusion surface; an intermediate surface 131B thereof is formed into a light conductive layer in order to minimize attenuation of light; and a lower surface 131C and a peripheral side surface 131D thereof are also roughly finished by a file or the like. When the light from the light source members 133A and 133B is irradiated laterally toward the diffusion plate 131, the light is repeatedly reflected and diffused at the reflective diffusion surface of the upper surface portion 131A and transmitted and diffused toward the lower surface portion 131C to thereby illuminate the whole surface of the tipped electronic part W attracted by the removing nozzle 11. It is to be noted that in case where the upper surface portion 131A of the diffusion plate 131 is formed into a reflective surface, not only the milky coating film 130 but also, for example, an aluminum vaporized layer may be applied thereto, and a black coating layer may be further applied to the milky coating layer 130. It is further to be noted that the lower surface portion 131C and the peripheral side surface 131D of the diffusion plate 131 may be coated, other than the rough finishing by the file or the like, with glass impalpable powder or aluminum impalpable powder.

Since the second diffusion plate 132 moves upward and downward together with the removing nozzle 11, it is necessary for the first diffusion plate 131 to provide with a hose through which the removing nozzle 11 may be extended vertically movably. Therefore, the diffused light of the first diffusion plate 131 does not reach the tipped electronic part W, if it is of a small size, attracted by the removing nozzle 11, due to the formation of a clearance caused by the aforesaid hole. In view of this, the light irradiated by the second light source members 134A and 134B is reflected and diffused by the second diffusion plate 132 whereby the light is positively irradiated on the tipped electronic part W attracted by the removing nozzle 11.

As shown in FIG. 26, I designates a removing station for removing tipped electronic parts W from the part supply device 124, and II designates a first nozzle rotation correcting station for rotatively correcting a position detection, an attitude or the like of the tipped electronic part W attracted by the removing nozzle 11.

The first nozzle rotation correcting station II is provided with a part recognizing device 200 as recognition means, by which device 200 the state of a position detection, an attitude or the like of the tipped electronic part attracted by the removing nozzle 11 are recognized, and the rotative correction of the tipped electronic part W is effected on the basis of the recognized data.

Particularly, the first nozzle rotation correcting station II performs the correction for the tipped electronic parts W having a high precision in a mounting pattern to the print substrate P, as in the tipped electronic parts W having a lead wire such as SOP (Small Outline Package), QFP (Quad Flat Package), etc. re-recognition is repeatedly carried out by the part recognizing device 200 till the complete correction is terminated.

III designates a second nozzle rotation correcting station for carrying out a rotative correction of tipped electronic parts W having no lead wire, for example, such as LCC (Leadless Chip Carrier). Correction is once carried out on the basis of the recognized data by the part recognizing device 200.

IV designates a part mounting station for mounting the tipped electronic parts W, which have been corrected in the first nozzle rotation correcting station II or the second nozzle rotation correcting station III, on the print substrate P.

V designates an ejection station for ejecting tipped electronic parts W which have been recognized to be defective by the part recognizing device 200.

VI designates a nozzle selection station for selecting a removing nozzle 11 of a removing head portion 10 corresponding to a tipped electronic part W removed in the removing station I.

In the nozzle selection station VI, the desired removing nozzle 11 is selected by rotation of a drive gear 136 as nozzle selection means by the driving of a drive gear servomotor 135 moved by a drive system not shown and meshed with a gear (not shown) provided in the outer diameter portion of the removing head portion 10.

VII designates an original point locating station for adjusting a position of an original point in a rotational direction of the removing nozzle 11. The original point locating station VII adjusts the removing nozzle 11 to a stand-by position of the tipped electronic part W when the latter is removed by the removing nozzle in the removing station I.

Figure 28:
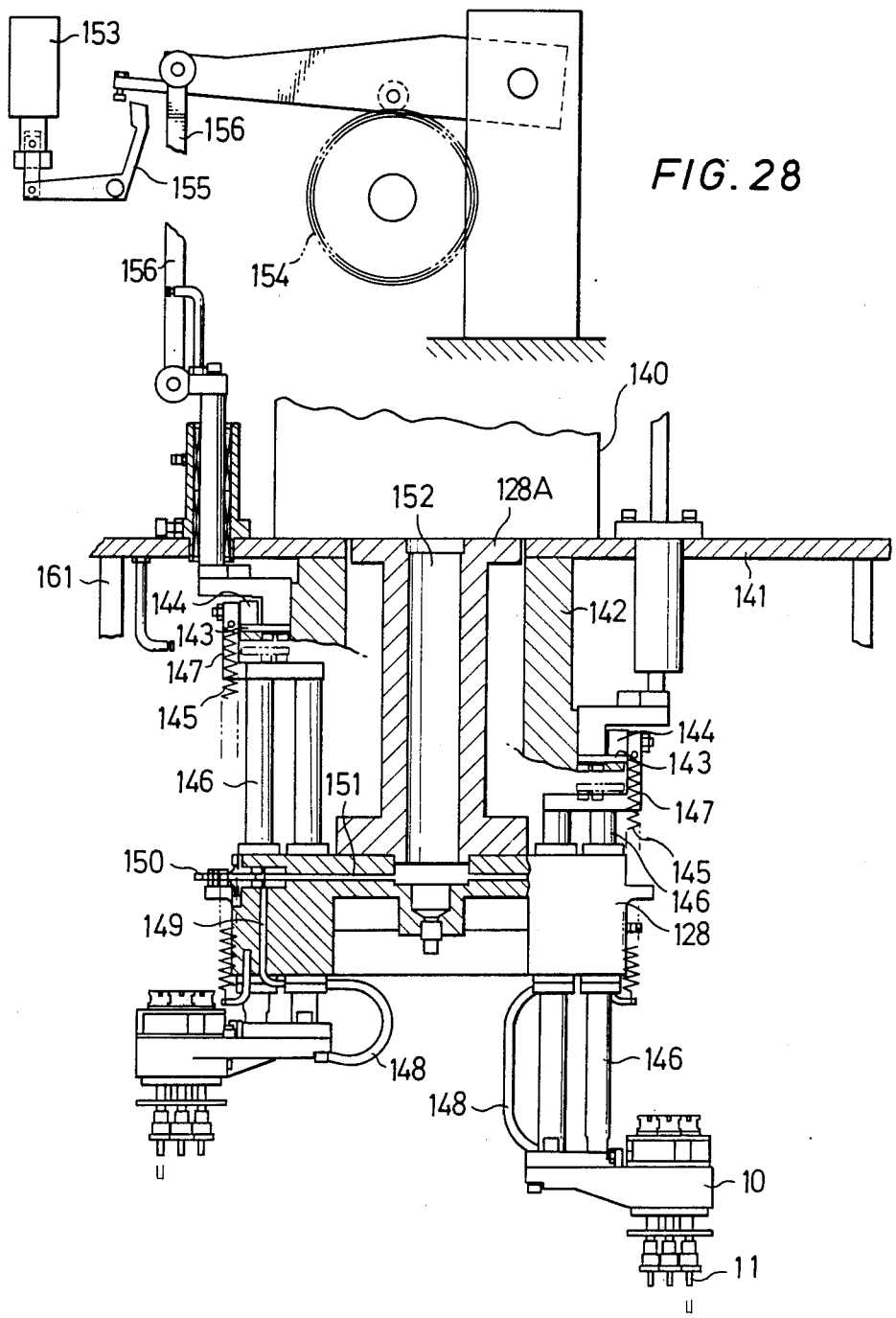
FIG. 28 illustrates a state of operation of a rotary board.

As shown in FIG. 28, a cylindrical portion 128A is formed above the rotational board 128, and a cylindrical cam member 142 for guiding the rotational board hung from and secured to a mounting bed 141 of an index unit 140 is disposed in the outer periphery at the upper portion of the cylindrical portion 128A.

The cam member 142 is formed in the peripheral side at the lower end thereof with a cam 143 over approximately whole periphery thereof. A roller 144 as a sliding portion provided on the upper end of each of the removing head portions 10 rolls on the upper surface of the cam 143 while being urged through a spring 145, and is moved up and down as the rotational board 128 of each of the removing head portions 10 rotates.

Reference numeral 146 designates a pair of guide rods stood upright on each of the removing head portions 10. The guide rods 146 are provided to vertically movably extend through the rotational board 128, and a support member 147 for rotatably supporting the roller 144 is secured to the upper end thereof. Accordingly, each of the removing head portions 10 is vertically movably supported as the rotational board 128 rotates.

Reference numeral 148 designates a first hose communicated with a vacuum pump not shown. The hose 148 has the other end connected to a second hose 149 which extends through the rotational board 10, the second hose 149 being communicated with the vacuum pump through a switching valve 150 and intake passages 151 and 152.

Reference numeral 153 designates an attraction clutch solenoid for defining a downward movement of the removing head portion 10 in the removing station I to stop the removing work of the tipped electronic part W caused by the attraction of the removing nozzle 11.

The attraction clutch solenoid 153 comprises a cam mechanism 154, an abutment lever 155 driven by the cam mechanism 154, and a vertically movable lever 156 for defining the removing head portion 10 so as not to be moved downward due to the abutment of the abutment lever 155. Such a work stopping mechanism is also provided in the mounting station IV.

Figure 29:
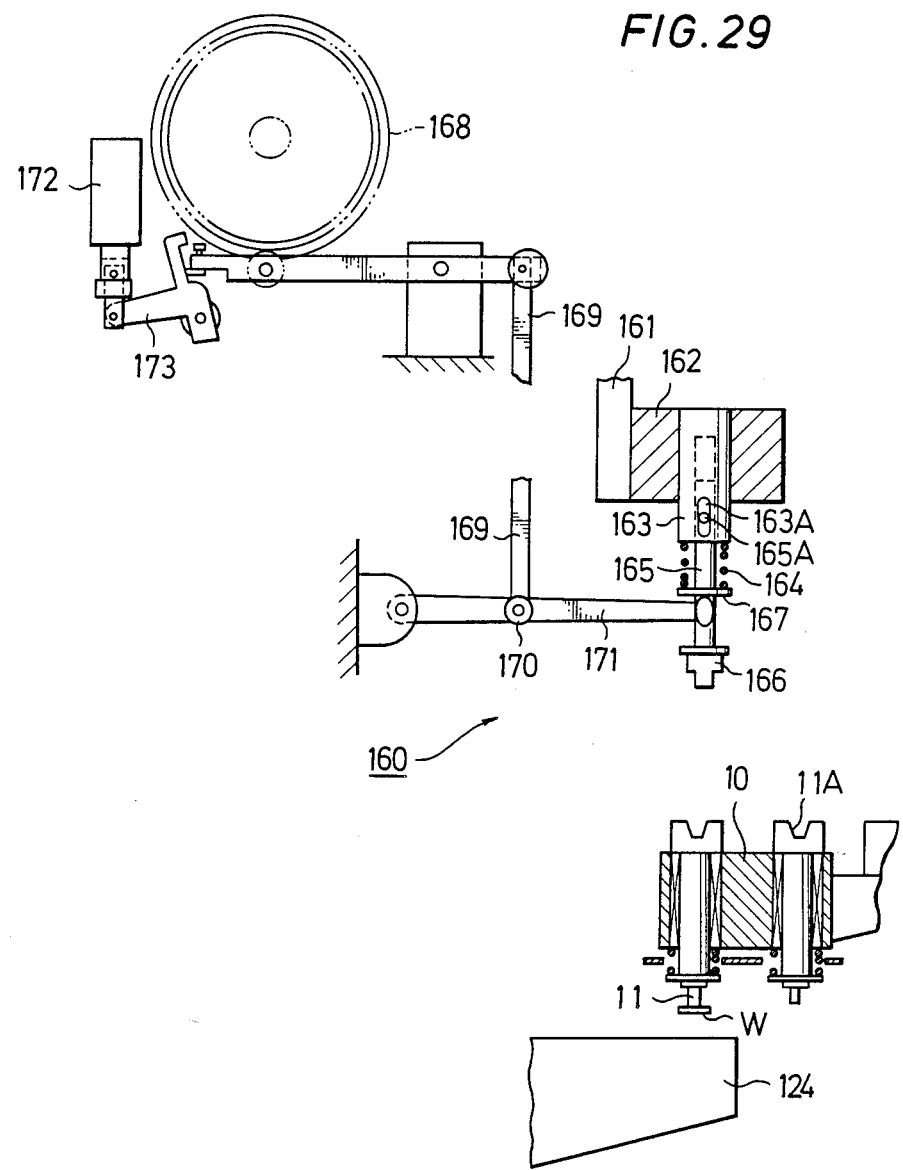
FIG. 29 illustrates a first removing nozzle rotation-correcting station.

Reference numeral 160 designates a nozzle positioning device in the removing station I. The nozzle positioning device 100 comprises, as shown in FIG. 29, a mounting plate 161 hung from and secured to the mounting bed 141 of the index unit 140, a holding member 162 secured to the mounting plate 161, a nozzle positioning member 163 mounted on the holding member 162, a nozzle positioning rod 165 fitted in the nozzle positioning member 163 through a spring 164 as a cushioning means, and a nozzle positioning and fitting portion 166 provided at the lower end of the nozzle positioning rod 165 and fitted in a groove to be fitted 11A formed in the upper end of the removing nozzle 11. Projected from the nozzle positioning rod 165 is an engaging pin 165A in engagement with a longitudinal slot 163A formed in the nozzle positioning member 163 to define the range of vertical movement thereof.

Reference numeral 167 designates a holding portion for holding a spring 164 formed on the nozzle positioning rod 165. A swinging lever 171 mounted on a vertically movable lever 169 moved up and down by the rotation of the cam mechanism 168 through a rod end 170 is held at the holding portion 167. This swinging lever 171 is swung by the upward and downward movement of the vertically movable lever 169 to cause the nozzle positioning rod 165 to be moved upward and downward while being urged by the bias of the spring 164.

Reference numeral 172 designates a positioning clutch solenoid for defining the downward movement of the nozzle positioning device 160 caused by the downward movement of the swinging lever 171. The positioning clutch solenoid 172 is provided with an abutment lever 173 for defining the upward and downward movement of the vertically movable lever 169 caused by the cam mechanism 168 through the expansion of the solenoid 172.

The part recognizing device 200 will be described hereinafter with reference to FIGS. 30 and 31.

As shown in FIG. 30, reference numeral 201 designates a first part image pickup camera formed from a high-magnification CCD camera for photographing and recognizing the state where a small-sized tipped electronic part W is attracted by the removing nozzle 11, and reference numeral 202 designates a second part image pickup camera formed from a low-magnification CCD camera for photographing and recognizing the attracted state of a large-sized tipped electronic part W.

Both the cameras 201 and 202 utilize transmission and reflection of prisms 204A, 204B, 204C and 204D provided interiorly of an optical system box 203 located below the removing nozzle 11 of the removing head portion 10, and pick up an image of the tipped electronic part W attracted by the removing nozzle focussed through lenses 205, 206A, 206B, 207A and 207B to recognize it. Reference numeral 208 designates a drive motor for laterally moving a lens mounting member 209 of the lens 205 through a linear guide 210. The drive motor 208 drives the lens mounting member 209 so that focussing of the lens 205 is effected according to the thickness of the tipped electronic part W through a cam 211 and a bearing 212.

That is, FIG. 30 shows the case where the small-sized tipped electronic part W is recognized, and FIG. 31 shows the state of attraction of the tipped electronic part W to the removing nozzle 11 and the arrangement of the first and second diffusion plates 131 and 132.

Reference numeral 300 designates a first nozzle rotation positioning device in the first nozzle rotation positioning station II, and reference numeral 400 designates a second nozzle rotation positioning device in the second nozzle rotation correcting station III. Since both the nozzle rotation positioning devices 300 and 400 have the same construction, the operation thereof will be described with reference numerals repeated in FIGS. 32 and 33.

Reference numeral 301 or 401 designates a first or second nozzle rotating motor for rotating the removing nozzle through $\theta$, an output shaft 302 or 402 thereof having a vertically movable means 303 or 403 mounted thereon. The vertically movable means 303 or 403 comprises a nozzle rotational member 306 or 406 fitted in a bearing member 305 or 405 through a coupling 304 or 404, and a nozzle rotational rod 307 or 407.

The nozzle rotational rod 307 or 407 is provided at the lower end thereof with a nozzle rotating fitting portion 308 or 408 fitted in a groove to be fitted 11A cut in the upper end surface of the removing nozzle 11 and is fitted in the nozzle rotational member 306 or 406 through a spring 309 or 409 as a cushioning means.

The nozzle rotational rod 307 or 407 is projectingly provided with an engaging pin 307A or 407A in engagement with a longitudinal slot 306A or 406A formed in the nozzle rotational member 306 or 406 to define the range of upward and downward movement thereof.

Reference numerals 310 and 410 designate holding portions for holding a spring 309 or 409 formed on the nozzle rotational rod 307 or 407. A swing lever 313 or 413 mounted on a vertically movable lever 311 or 411 moved upward and downward by a drive source not shown through a rod end 312 or 412. The swing lever 313 or 413 is swung by the upward and downward movement of the vertically movable lever 311 or 411 to move upward and downward the nozzle rotational rod 307 or 407 while being urged by the bias of the spring 309 or 409. It is to be noted that in this case, for example, a ball spline may be used as the vertically movable means 303 or 403.

Figure 34:
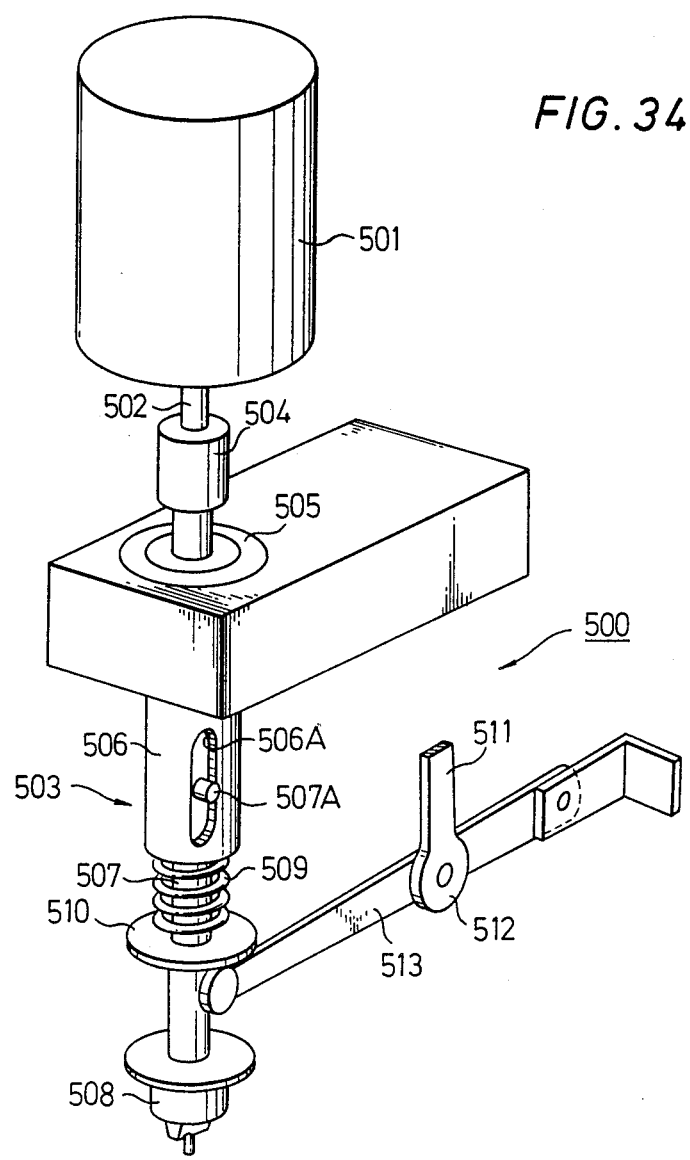
FIG. 34 is a perspective view of a third removing nozzle rotation positioning mechanism.

Next, the operation of a third nozzle rotation positioning device 500 in the nozzle original point locating station VII will be described with reference to FIGS. 34 and 35.

Reference numeral 501 designates a third nozzle rotating motor for rotating the removing nozzle 11 through $\theta$, and a vertically movable means 503 is mounted on an output shaft 502 thereof.

The vertically movable means 503 comprises a nozzle rotational member 56 fitted in a bearing member 505 through a coupling 504 and a nozzle rotational rod 507.

The nozzle rotational rod 507 is provided at the lower end thereof with a nozzle rotating fitting portion 508 fitted in a groove to be fitted 11A cut in the upper end surface of the removing nozzle 11, and is fitted in the nozzle rotational member 506 through a spring 509 as a cushioning means.

The nozzle rotational rod 507 is projectingly provided with an engaging pin 507A in engagement with a longitudinal slot 506 formed in the nozzle rotational member 506 to define the range of upward and downward movement thereof.

Reference numeral 510 designates a holding portion for holding a spring 509 formed on the nozzle rotational rod 507. A swing lever 513 mounted on a vertically movable lever 511 moved upward and downward by a drive source not shown through a rod end 512 is held at the holding portion 510. The swing lever 513 is swung by the upward and downward movement of the vertically movable lever 511 to move upward and downward the nozzle rotational rod 507 while being urged by the bias of the spring 509.

Figure 35:
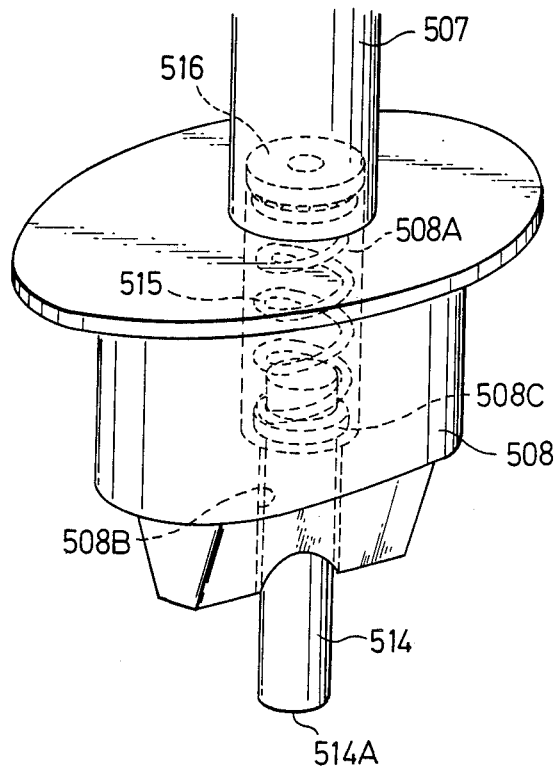
FIG. 35 is a partly enlarged perspective view of a tip portion of a nozzle in the third removing nozzle rotation positioning mechanism.

The nozzle rotating fitting portion 508 is stepwisely formed, in upper and lower axial directions in the center portion thereof, with a large diameter first cavity 508A and a small diameter second cavity 508B in communication with the first cavity 508A, as shown in FIG. 35, and an abutment rod 514 as a brake means is inserted from the top into a cavity portion of the first and second cavities 508A and 508B. The abutment rod 514 is urged by means of a spring 515 held at a shoulder 508C of the first and second cavities 508A and 508B, and an extreme end 514A thereof is rotatably projected at the lower end of the nozzle rotating fitting portion 508 and comes into abutment with the portion to be fitted 11A formed on the upper end of the removing nozzle 11 to define the rotation of the removing nozzle 11 before being fitted.

A thrust bearing 516 is provided on the reception side of the spring 515 held on the side of the nozzle rotational rod 507 so that the abutment rod 514 will not rotate even the nozzle rotating fitting portion 508 rotates so as not to transmit the turning force resulting from a torsion caused by the rotation of the nozzle rotational rod 507.

Figure 36:
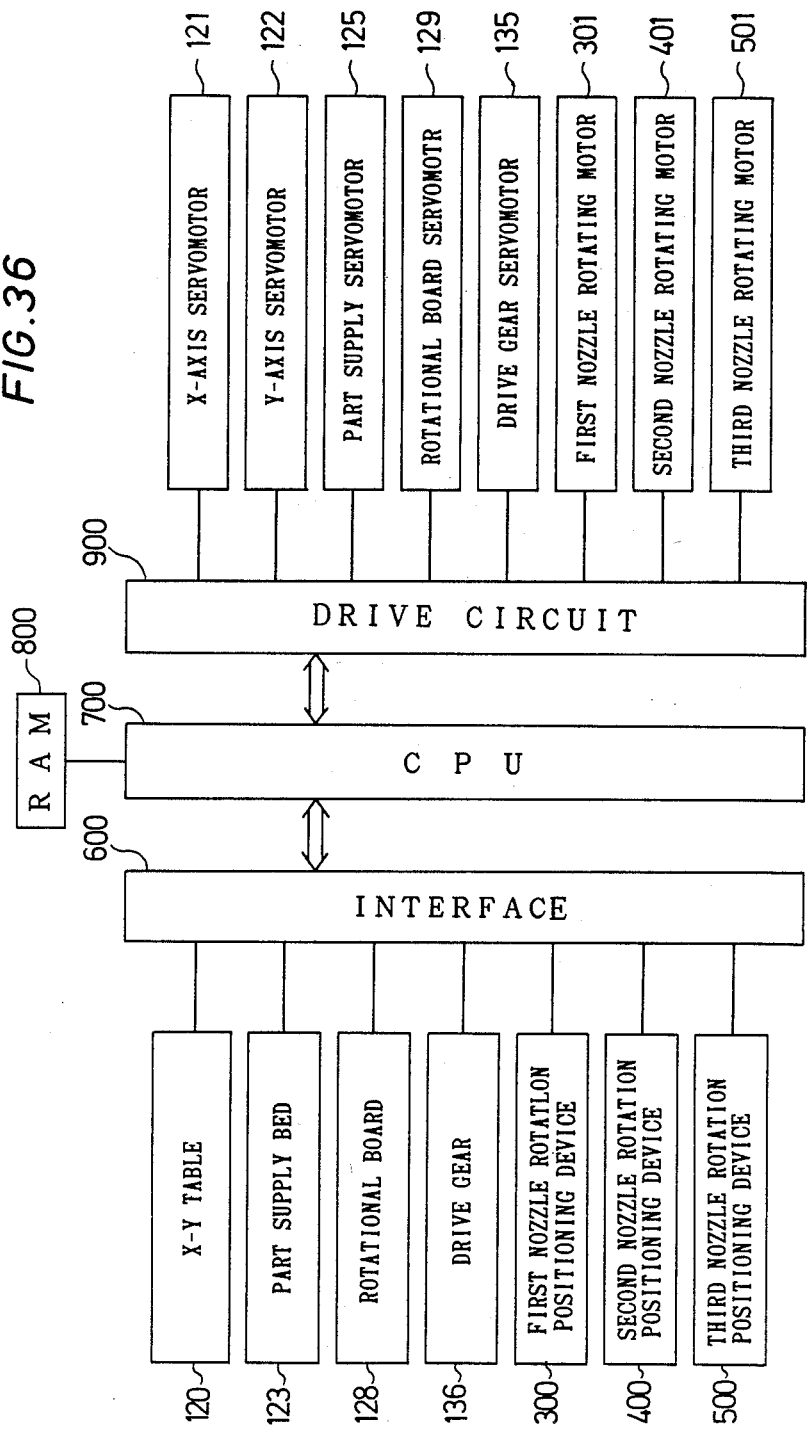
FIG. 36 is a control circuit for the electronic parts automatic mounting apparatus.

FIG. 36 shows a circuit structure for controlling the automatic mounting apparatus in the third embodiment according to the present invention. Reference numeral 600 designates an interface. Connected to the interface 600 are an X-Y table 120, a part supply bed 123, a rotary board 128, a drive gear 136 and first to third nozzle rotation positioning devices 300, 400 and 500, which are controlled in accordance with programs of CPU 700 as a controller.

Reference numeral 800 designates RAM for storing switching data of the high-magnification first CCD camera 201 or low-magnification second CCD camera 202 according to the tipped electronic parts W and data of an amount of movement of the lens mounting member 209 with respect to the thickness of the tipped electronic parts W. The RAM 800 stores, in predetermined areas thereof, data of rotational center position of the removing nozzle 11, data of recognized position of the tipped electronic parts W attracted by the removing nozzle 11 by the part recognizing device 200, and data of mounting the tipped electronic parts W on the print substrate P (X, Y and $\theta$ directions).

Figure 37:
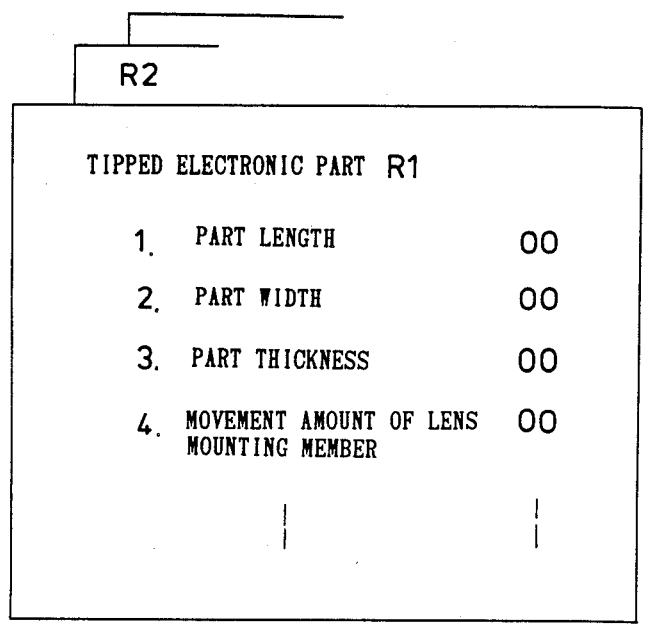
FIG. 37 illustrates data regarding tipped electronic parts.

FIG. 37 shows data of the tipped electronic parts W stored in the RAM 800, for example, such as data of length and thickness of the parts, amount of movement of the lens mounting member, etc.

A set position of the rotational center of the removing nozzle 11 becomes possibly deviated due to a change in temperature, a change with a lapse of time or the like. Therefore, when a temperature exceeds a set temperature or when a certain time passes, each of the removing nozzles 11 by which tipped electronic part W is not attracted is recognized by the part recognizing device 200 so that the amount of deviation of the rotational center of the removing nozzle 11 may be re-stored in the RAM 800 or the amount of deviation may be added to the rotational center of the removing nozzle 11.

Reference numeral 900 designates a drive circuit connected to the CPU 700. Connected to the drive circuit 900 are an X-axix servomotor 121, a Y-axis servomotor 122, a servomotor 125 in the part supply portion, a servomotor 129 in the rotational board, a drive gear servomotor 135 and first to third nozzle rotating motors 301, 401 and 501.

Figure 38:
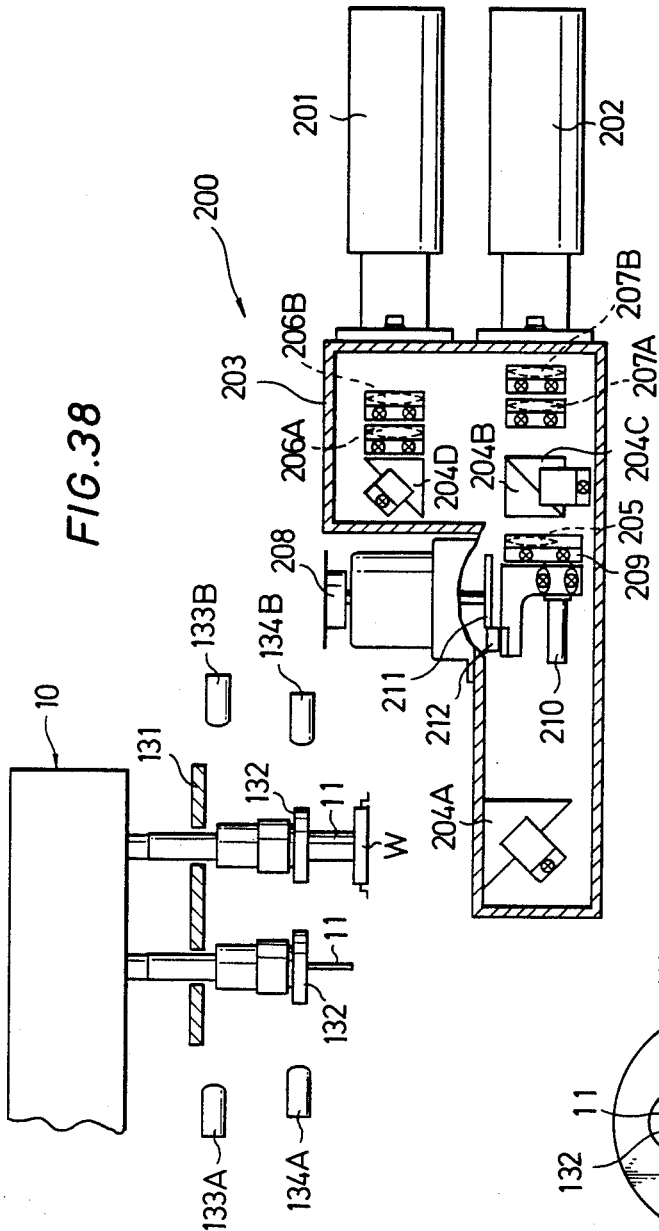
FIG. 38 illustrates a state of recognizing large-sized tipped electronic parts.
Figure 39:
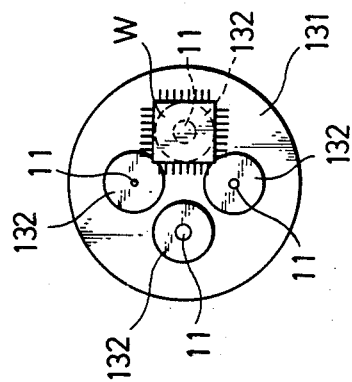
FIG. 39 illustrates the removing nozzle as viewed from the underside in the state of recognizing the large-sized tipped electronic part.

FIG. 38 shows an arrangement wherein large-sized tipped electronic parts W are recognized. FIG. 39 shows the state of attraction of the tipped electronic part W on the removing nozzle 11 and the arrangement of the first and second diffusion plates 131 and 132.

The operation of the automatic mounting apparatus in the third embodiment according to the present invention.

First, prior to the initiation of the operation of mounting the tipped electronic part W on the print substrate P, the part recognizing device 200 recognizes the position of the rotational center of each of the removing nozzle 11, that is, a position at which reference points of image centers of the first and second CCD cameras 201 and 202 comprise a reference, and the RAM 800 stores therein data of the position of the rotational center.

At this time, the work of recognizing the center position of the removing nozzle 11 is accomplished, for example, by attracting a jig not shown on the removing nozzle 11, rotating the jig with the rotation of the removing nozzle 11, causing the part recognizing device 20 to recognize a hole provided in the jig during rotation at a position of the rotational angle of the removing nozzle and obtaining the rotational center of the removing nozzle 11 by computation using a computer device not shown on the basis of the recognized result.

According to another method for the work of recognizing the center position of the removing nozzle 11, trial mounting of tipped electronic parts W is actually carried out while varying the mounting angle, an amount of deviation between the mounted position and the rotational center of the removing nozzle 11 is measured, and the resultant value is inputted into the RAM 800 by an input device.

After the work of recognizing the center position of the removing nozzle 11 has been terminated in a manner as described, the servomotor 135 in the part supply portion is driven to move the part supply bed 123 to the removing station 1, and the desired part supply device 124 is made to assume a part removing position for stand-by.

The removing head portion 10 is moved to and above the tipped electronic part W received in the part supply device 124 during stand-by, as shown in FIG. 29, so as to correspond to the removing nozzle 11, which is moved downward to attract and retain the tipped electronic part W.

In attracting the tipped electronic part W by the removing nozzle 11, the cam mechanism 168 is driven to move downward the vertically movable lever 169, the swing lever 171 is swung downward in association with the vertically movable lever 169, and the nozzle positioning fitting portion 166 is brought into abutment with the groove to be fitted 11A formed in the upper end surface of the removing nozzle 11 in the state biased by the spring 164. Then, under such a fitting state, the removing nozzle 11 is moved down-ward so that the lower end thereof is lowered to a position of the tipped electronic part W received in the part supply device 124 to thereby define the rotation of the removing nozzle 11 due to the shock at the time of attraction, upward and downward movement of the removing nozzle 11 and the like and prevent a deviation in position of the original point located at the original point locating station VII.

Next, the operation of correcting rotation of the tipped electronic part W in a direction of $\theta$ in the first nozzle rotation correcting station II will be described.

First, as shown in FIG. 37, whether or not the part size of the tipped electronic part W is within the range of the part size handled by the high-magnification first CCD camera 201 or low-magnification second CCD camera 202 is discriminated by discrimination means within CPU 700 on the basis of the data related to the tipped electronic parts W stored in the RAM 800. For example, in case where the first CCD camera 201 is used for recognition, the position of the tipped electronic part W from the image center of the first CCD camera 201 is recognized while illuminating the small-sized tipped electronic part W attracted by the removing nozzle 11 with the light directed at the first and second diffusion plates 131 and 132 and laterally irradiated by the first and second light source members 133A, 133B and 134A, 134B, and the thus recognized data ($X_1$, $Y_1$ and $\theta_1$) are stored in the RAM 800.

In case of recognizing the small-sized tipped electronic part W, even if a clearance caused by the formation of a through-hole for the removing nozzle is present in the first diffusion plate 131, an illumination light without uneven illumination can be obtained because the diffused light is irradiated toward the small-sized tipped electronic part W through the second diffusion plate 132. This recognized angle data $\theta_1$ is an angle formed by crossing lines obtained by extending one side of the image center and the end surface as a reference of the tipped electronic part W.

In the thus recognized result, the correcting operation on the basis of the angle data $\theta$ is accomplished by comparing the mounting angle data ($\theta$ direction) of the mounting position data stored in the RAM 800 with the recognized angle data ($\theta_1$) by use of a comparator not shown, and if there is an amount of deviation, computing the amount of deviation ($\theta$ direction $-\theta_1$) by use of a computer not shown, and storing it in the Ram 800 to effect correction of rotation.

That is, if the tipped electronic part W has a lead wire, the removing nozzle 11 is rotated by the first nozzle rotation positioning device 300 to correct it whereby the tipped electronic part W is located. After completion of positioning the tipped electronic part W, the removing head portion 10 moves to a next station.

After completion of the positioning correction in the direction of $\theta$, mounting of the tipped electronic part W on the print substrate P in the mounting station IV is carried out. The X-Y table 120 on which print substrate P is placed is moved to a position based on numerically controlled data (NC data) originally mounted in consideration of an amount to be corrected in a planar direction, before mounting.

FIGS. 38 and 39 show the illumination means for large-sized tipped electronic parts W. The recognition in this case is carried out by the second CCD camera 202 to effect correction of rotation.

At this time, in case where the tipped electronic part W is larger than the second diffusion plate 132, as shown in FIG. 39, the diffused light is directly irradiated from the first diffusion plate 131 to render irradiation without unevenness possible. In case of a tipped electronic part W having a rectangular parallelopiped whose two adjacent sides are extremely different in length and whose long side portion is positioned internally of the second diffusion plate 132, the diffused light of the second diffusion plate 132 is irradiated on the long side portion of the tipped electronic part W whereas the diffused light is directly irradiated on the short side portion of the tipped electronic part W through the first diffusion plate 131. Therefore even if the tipped electronic part W is a part which is so large as to be positioned over the first and second diffusion plates 131 and 132, irradiation of sufficient diffused light is rendered possible.

In this manner, recognition and rotation correcting work for the tipped electronic parts W are successively carried out. At this time, in odre to overcome out-of-focus resulting from a difference in thickness of the tipped electronic parts W, the drive motor 208 is driven on the basis of data related to the amount of movement of the lens mounting member 209 with respect to the thickness or the like of the tipped electronic parts W as shown in FIG. 37 to move the lens 205 for effecting focussing.

In the case where correction of the tipped electronic part W attracted by the removing nozzle 11 on the basis of the recognition of the part recognizing device 200 is further required, such correction is carried out in a manner similar to the first nozzle rotation positioning device 300 by the second nozzle rotation positioning device 400 in the second nozzle rotation correcting station III, thereby rendering the shortening of work time possible.

The tipped electronic part W judged to be defective in mounting by the part recognizing device 200 is moved to and ejected at the ejection station V by the rotation of the rotational board 128.

In the nozzle selection station VI, the selection of a removing nozzle 11 to be used next is carried out by rotating the removing head portion 10 through the rotation of the drive gear not shown caused by the driving of the drive gear servomotor 135.

In the nozzle original point locating station VII, the original point locating of the removing nozzle 11 selected in the nozzle selection station VI is carried out. In correcting a different position of the original by the previous correction of rotation of the removing nozzle, a rotation stop position of the third nozzle rotating motor 501 is set, and adjustment is made so that an original point of a rotational direction of the removing nozzle 11 which forms a reference when the tipped electronic part W is attracted is coincided by the driving of the third nozzle rotation positioning device 500.

Figure 40:
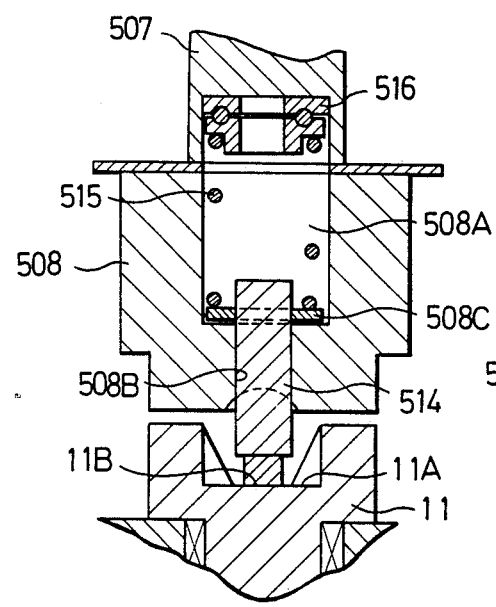
FIGS. 40 and 41 illustrate the fitting state between a fitting portion of the nozzle tip and a groove to be fitted in the removing nozzle rotation positioning mechanism.

In this case, as shown in FIG. 40, in fitting a nozzle rotating fitting portion 508 of the third nozzle rotation positioning device 500 into the groove to be fitted 11A formed in the upper end surface of the removing nozzle 11, fitting of the fitting portion 508 which is rotated and moved downward into the groove to be fitted 11A is effected through an abutment rod 514.

Figure 41:
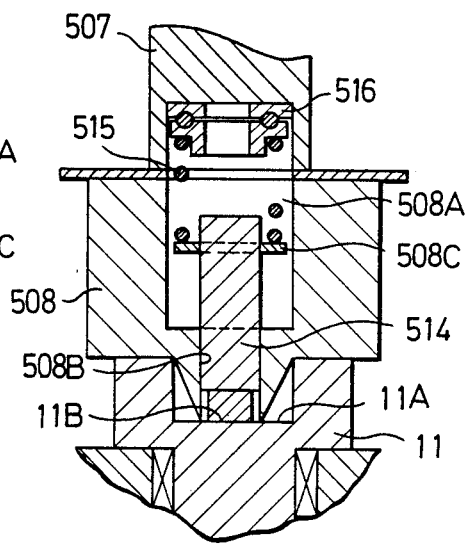

In the abutment state between the fitting portion 508 and the groove to be fitted 11A, since the abutment rod 514 projected on the fitting portion 508 is urged by a spring 515, a resistance occurs between the abutment rod 514 and the portion to be abutted 11B of the groove to be fitted 11A, as shown in FIG. 41 with the result that the fitting portion 508 becomes idling with respect to the abutment rod 514 so that both the directions can be always coincided till the fitting portion 508 rotates through 180° at maximum and then stops. Thereby, the removing nozzle 11 is always prepared at the original point position.

Figure 32:
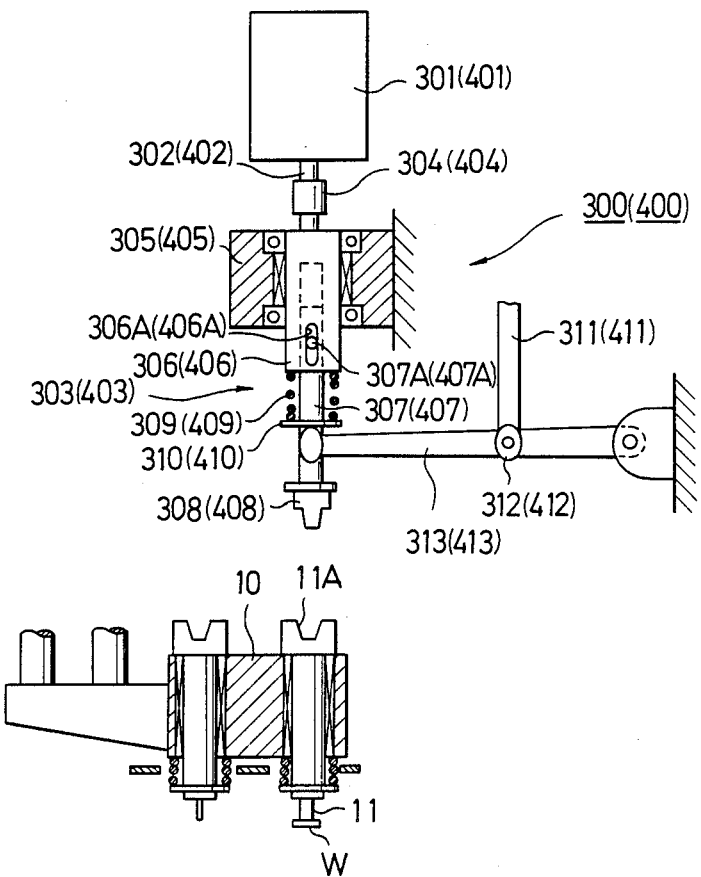
FIG. 32 is a side view of a first removing nozzle rotation positioning mechanism.
Figure 33:
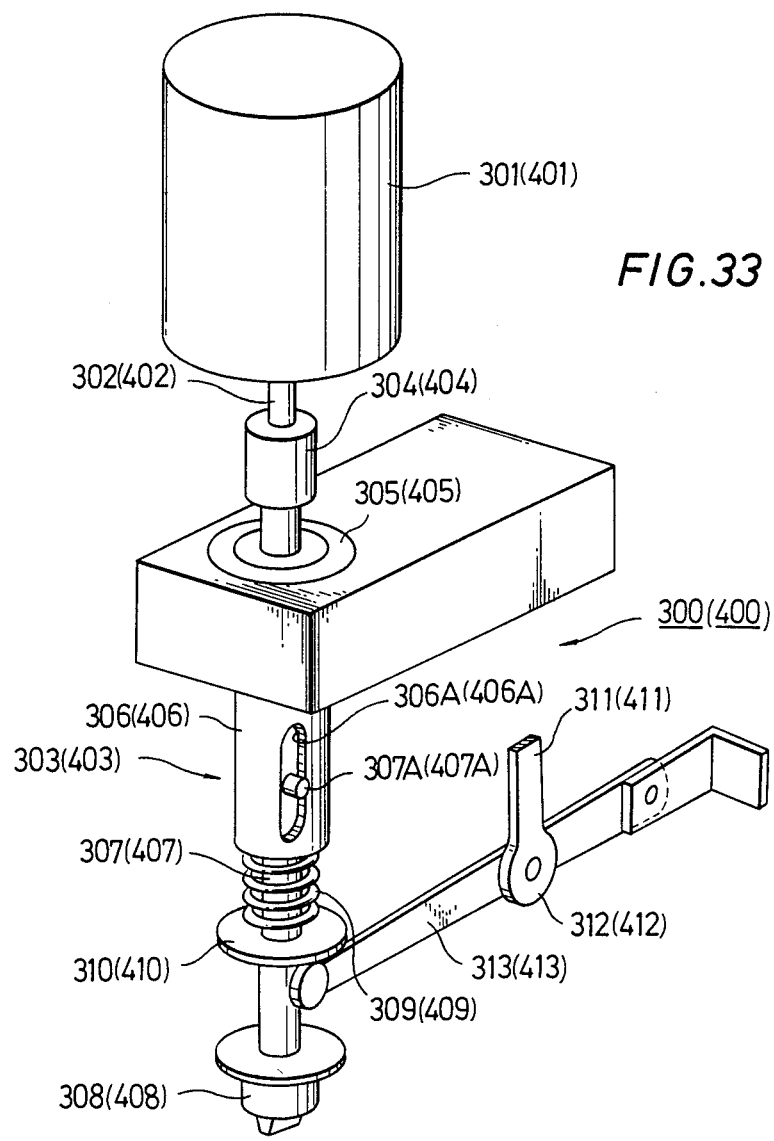
FIG. 33 is a perspective view of the first removing nozzle rotation positioning mechanism.
Figure 42:
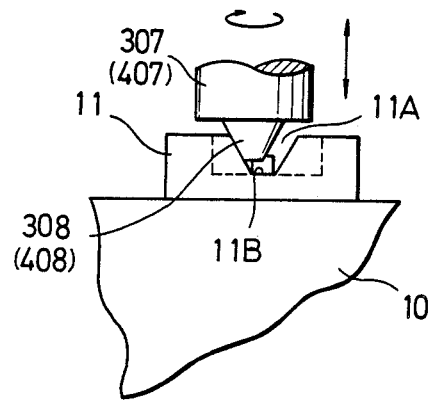
FIG. 42 illustrates an eccentric state between the nozzle tip and the groove to be fitted in the removing nozzle rotation positioning mechanism.

In fitting the fitting portion 308 or 408 into the groove to be fitted 11A at the time of correcting rotation of the nozzle, as shown in FIG. 32, even if both the portions are somewhat eccentric with each other to form a deviation in position as shown in FIG. 42, fitting of the fitting portion 308 or 408 which is rotated and moved downward into the groove to be fitted 11A can be effected smoothly because the groove to be fitted 11a has a V-shaped tapered surface in section, and the correction of rotation of the removing nozzle 11 can be rotated as desired.

Figure 43:
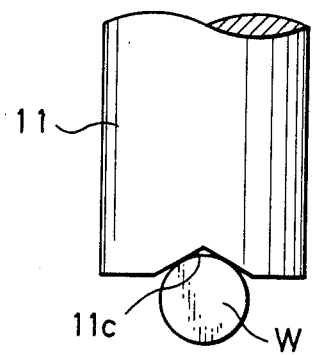
FIG. 43 illustrates the state of attracting and holding a cylindrical tipped electronic part by means of a removing nozzle having a directivity.

Moreover, even if a V-shaped groove 11C is formed to have a directivity in the attraction end surface of the removing nozzle 11 in order to attract a cylindrical tipped electronic part W as shown in FIG. 43, if for example, the groove to be fitted 11A and the V-shaped groove 11C are directed in the same direction whereby the axial direction of the tipped electronic part W and the V-shaped groove 11C can be registered according to the style of the cylindrical tipped electronic part W supplied from the part supply device 124, which comprises the stopping direction of the groove to be fitted 11A, thus effecting positive ejection of parts.

What is claimed is:

1. An electronic parts automatic mounting apparatus comprising:
    a removing head portion having a removing nozzle mounted thereon;
    part recognizing means for recognizing a tipped electronic part attracted by said removing nozzle; and
    part mounting means for correcting a deviation in position of the tipped electronic part on the basis of the recognized result of said part recognizing means to mount the part on a print substrate; characterized in that said part recognizing means comprises
    illumination means; first diffusion means for irradiating a light from said illumination means toward the tipped electronic part attracted by said removing nozzle;
    second diffusion means for transmitting, diffusing and irradiating the diffused light from the first diffusion means toward said tipped electronic part; and
    position detecting means for detecting a position of said tipped electronic part on which diffused light is irradiated through said first and second diffusion means by use of a part image pickup camera.

2. The electronic parts automatic mounting apparatus according to claim 1, wherein the first diffusion means is mounted on said removing head portion, and the second diffusion means is mounted on the removing nozzle so as to be positioned below said first diffusion means.

3. The electronic parts automatic mounting apparatus according to claim 1, wherein a plurality of removing nozzles are disposed on said removing head portion, and each of said removing nozzles is made to vertically movably extend through a diffusion plate constituting said first diffusion means.

4. The electronic parts automatic mounting apparatus according to claim 1, wherein illumination means is disposed above said first diffusion means.

5. The electronic parts automatic mounting apparatus according to claim 1, wherein the illumination means is radially embedded within the diffusion plate constituting said first diffusion means.

6. The electronic parts automatic mounting apparatus according to claim 2, wherein a plurality of removing nozzles are disposed on said removing head portion, and each of said removing nozzles is made to vertically movably extend through a diffusion plate constituting said first diffusion means.

7. The electronic parts automatic mounting apparatus according to claim 2, wherein illumination means is disposed above said first diffusion means.

8. The electronic parts automatic mounting apparatus according to claim 3, wherein illumination means is disposed above said first diffusion means.

9. The electronic parts automatic mounting apparatus according to claim 2, wherein the illumination means is radially embedded within the diffusion plate constituting said first diffusion means.

10. The electronic parts automatic mounting apparatus according to claim 3, wherein the illumination means is radially embedded within the diffusion plate constituting said first diffusion means.

11. An electronic parts automatic mounting apparatus comprising:
   a removing head portion having a removing nozzle mounted thereon;
   part recognizing means for recognizing a tipped electronic part attracted by said removing nozzle; and
   part mounting means for correcting a deviation in position of the tipped electronic part on the basis of the recognized result of said part recognizing means to mount the part on a print substrate, characterized in that said part recognizing means comprises:
   first illumination means for laterally irradiating light;
   first diffusion means for diffusing and irradiating the light from the first illumination means toward the tipped electronic part attracted by said removing nozzle;
   second illumination means disposed below said first illumination means for laterally irradiating light;
   second diffusion means for diffusing and irradiating the light from said second illumination means toward the tipped electronic part attracted by said removing nozzle; and
   position detecting means for detecting a position of said tipped electronic part on which diffused light is irradiated through said first and second diffusion means by a part image pickup camera.

12. The electronic parts automatic mounting apparatus according to claim 11, wherein the first diffusion means is mounted on said removing head portion, and the second diffusion means is mounted on said removing nozzle so as to be positioned below said first diffusion means.

* * * * *